(12) United States Patent
Hasei et al.

(10) Patent No.: US 10,734,715 B2
(45) Date of Patent: Aug. 4, 2020

(54) PORTABLE ELECTRONIC APPARATUS

(71) Applicant: SEIKO EPSON CORPORATION, Tokyo (JP)

(72) Inventors: Hironori Hasei, Azumino (JP); Noriaki Hiraide, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 79 days.

(21) Appl. No.: 16/043,888

(22) Filed: Jul. 24, 2018

(65) Prior Publication Data
US 2019/0051975 A1 Feb. 14, 2019

(30) Foreign Application Priority Data
Aug. 8, 2017 (JP) ................... 2017-152973

(51) Int. Cl.
*H01Q 1/27* (2006.01)
*H01Q 1/24* (2006.01)
*G06F 1/16* (2006.01)
*G04R 20/02* (2013.01)
*G04R 60/10* (2013.01)
*G04G 19/00* (2006.01)
*H01L 31/042* (2014.01)
*H01Q 1/44* (2006.01)
*G04C 10/02* (2006.01)
(Continued)

(52) U.S. Cl.
CPC ............ *H01Q 1/273* (2013.01); *G04C 10/02* (2013.01); *G04G 19/00* (2013.01); *G04G 21/025* (2013.01); *G04R 20/02* (2013.01); *G04R 60/10* (2013.01); *G04R 60/12* (2013.01); *G06F 1/163* (2013.01); *G06F 1/1635* (2013.01); *G06F 1/1637* (2013.01); *G06F 1/1658* (2013.01); *G06F 1/1694* (2013.01); *G06F 1/1698* (2013.01); *G06F 1/263* (2013.01); *H01L 31/042* (2013.01); *H01Q 1/247* (2013.01); *H01Q 1/44* (2013.01); *H02S 99/00* (2013.01)

(58) Field of Classification Search
CPC ............ H01Q 1/273; H01Q 1/44; H01Q 1/27; H01Q 1/247; G06F 1/16; G06F 1/1637; G06F 1/1694; G06F 1/263; G06F 1/1658; G04C 10/02; G04G 21/025; G04G 19/00; H01L 31/042; G04R 60/10; G04R 60/12
USPC ........................................ 343/718
See application file for complete search history.

(56) References Cited

U.S. PATENT DOCUMENTS 9,411,315 B2    8/2016  Sawada
2012/0120772 A1*  5/2012  Fujisawa ............... G04C 10/02
                                                    368/64

(Continued)

FOREIGN PATENT DOCUMENTS

JP    2016-176957 A    10/2016

*Primary Examiner* — Hai V Tran
(74) *Attorney, Agent, or Firm* — Oliff PLC

(57) ABSTRACT

A portable electronic apparatus includes a case, a solar cell disposed in the case, a GPS antenna as an antenna section disposed in the case, including a base as a nonconductive member and a conductive body disposed on a surface of the nonconductive member, and adapted to receive a positioning satellite signal, and a circuit board disposed in the case, and electrically connected to the solar cell and the antenna section, and the antenna section overlaps the solar cell in a planar view viewed from a normal direction of light receiving surfaces of the solar cell.

8 Claims, 12 Drawing Sheets

(51) Int. Cl.
*G06F 1/26* (2006.01)
*G04G 21/02* (2010.01)
*G04R 60/12* (2013.01)
H02S 99/00 (2014.01)

(56) References Cited

U.S. PATENT DOCUMENTS

2019/0021617 A1* 1/2019 Uemura ................ H01L 31/042
2019/0021662 A1* 1/2019 Hiraide .................. A61B 5/742
2019/0025767 A1* 1/2019 Uemura ............... G04G 21/025
2019/0025876 A1* 1/2019 Hiraide .................. G04R 20/02

* cited by examiner

PORTABLE ELECTRONIC APPARATUS

CROSS-REFERENCES TO RELATED APPLICATIONS

This application claims priority to Japanese Patent Application No. 2017-152973, filed Aug. 8, 2017, the entirety of which is herein incorporated by reference.

BACKGROUND

1. Technical Field

The present invention relates to a portable electronic apparatus.

2. Related Art

In the past, there has been known a portable electronic apparatus such as a wrist device mounted on a region such as a wrist with a band or the like, and provided with a clock display function and a position display function. In, for example, JP-A-2016-176957 (Document 1), a so-called analog wristwatch which is mounted on the body of the wearer and is provided with a patch antenna for receiving a GPS (Global Positioning System) radio wave from a GPS satellite (a positioning satellite) as an example of the positioning system, a solar panel for performing self-power generation, and so on is disclosed as an example of the portable electronic apparatus.

However, the patch antenna used in the analog wristwatch disclosed in Document 1 is made capable of receiving the GPS radio wave by using a dielectric substance high in relative permittivity, and therefore grows in size. With respect to the analog wristwatch disclosed in Document 1, in the case in which such a patch antenna is used in a so-called digital display-type portable electronic apparatus performing digital display using a display panel, there is a problem that the portable electronic apparatus grows in size since the patch antenna is too large in size in the case of installing the display panel, the GPS function, the solar panel, or a variety of sensors.

SUMMARY

An advantage of some aspects of the invention is to solve at least a part of the problems described above, and the invention can be implemented as the following forms or application examples.

Application Example 1

A portable electronic apparatus according to this application example includes a case, a solar cell disposed in the case, an antenna section disposed in the case, including a nonconductive member and a conductive body disposed on a surface of the nonconductive member, and adapted to receive a positioning satellite signal, and a circuit board disposed in the case, and electrically connected to the solar cell and the antenna section, wherein the antenna section overlaps the solar cell in a planar view viewed from a normal direction of a light receiving surface of the solar cell.

According to the portable electronic apparatus according to this application example, since the antenna section can compactly be constituted by the nonconductive member and the conductive body disposed on the surface of the nonconductive member, the antenna can be made small in size. Further, since the nonconductive member constituting the antenna section for receiving the radio signal related to the signal to be obtained by the processing section supported by the circuit board, in other words, at least apart of the antenna, is disposed so as to overlap the solar cell in the planar view of the light receiving surface of the solar cell, it becomes possible to house the antenna in the case even in the small-sized portable electronic apparatus.

Application Example 2

In the portable electronic apparatus according to the application example described above, it is preferable that there are further included a processing section supported by the circuit board, and a connection section adapted to electrically connect the antenna section and the processing section to each other, and supported by the circuit board, and the connection section overlaps the solar cell in the planar view.

According to this application example, since the connection section for electrically connecting the antenna section and the processing section to each other is disposed so as to overlap the solar cell in the planar view of the light receiving surface of the solar cell, it is possible to increase the degree of freedom of the arrangement layout of the antenna section and the processing section, and at the same time, the compact arrangement can be achieved. Further, it is possible to increase the light receiving area of the solar cell without affecting the receiving sensitivity of the antenna, and thus, it is possible to increase the production of electricity in the solar cell.

Application Example 3

In the portable electronic apparatus according to the application example described above, it is preferable that the case has an opening section opening on one side in the normal direction, the solar cell is provided with an outer edge part shorter than an inner circumferential length of the opening section, and an inner edge part shorter in length than the outer edge part in the planar view, and at least a part of the connection section is disposed between the outer edge part and the inner edge part.

According to this application example, since at least either one of the nonconductive member constituting the antenna section and the connection section is disposed between the outer edge part along the inner circumference of the opening of the case and the inner edge part shorter in length than the outer edge part, it is possible to increase the degree of freedom of the arrangement layout of the antenna section and the processing section, and at the same time, it is possible to improve the receiving sensitivity of the antenna section due to the capacitive coupling between the antenna section and the solar cell.

Application Example 4

In the portable electronic apparatus according to the application example described above, it is preferable that the antenna section is disposed between the solar cell and the circuit board in a cross-sectional view viewed from a direction perpendicular to a normal direction of the light receiving surface.

According to this application example, it is possible to use the wavelength shortening effect by using the circuit board as the dielectric body in addition to the nonconductive member, and thus, it is possible to make the antenna section more compact (smaller in size). Further, due to the capacitive coupling between the antenna section and the circuit board, it is possible to improve the receiving sensitivity of the antenna section.

Application Example 5

In the portable electronic apparatus according to the application example described above, it is preferable that at least a part of the nonconductive member overlaps the solar cell in the planar view.

According to this application example, since at least a part of the nonconductive member overlaps the solar cell in the planar view, due to the capacitive coupling between the nonconductive member and the solar cell, the receiving sensitivity of the antenna section can be improved.

Application Example 6

In the portable electronic apparatus according to the application example described above, it is preferable that the connection section is a contact point adapted to electrically connect the conductive body and the processing section to each other.

According to this application example, due to the connection section (the contact point) supported by the circuit board, the electrical connection between the processing section and the antenna section as a separated member can compactly be achieved on the circuit board.

Application Example 7

In the portable electronic apparatus according to the application example described above, it is preferable that there is further included a display section electrically connected to the processing section, and an outer circumferential end part of the display section is disposed between the outer edge part and the inner edge part of the solar cell in the planar view.

According to this application example, since the outer circumferential end part of the display section is disposed between the outer edge part and the inner edge part of the solar cell in the planar view, in other words, the outer circumferential end part of the display section overlaps the solar cell, it is possible to improve the arrangement balance between the solar cell and the display section. Thus, a larger area of the solar cell can be ensured while ensuring the area of the display section.

Application Example 8

In the portable electronic apparatus according to the application example described above, it is preferable that the antenna section is disposed on an outer side of a contour of the display section in the planar view.

According to this application example, since the antenna section is disposed on the outer circumference side of the case, it is possible to increase the degree of freedom of the arrangement layout of the display section, the solar cell, and so on, and thus, it is possible to more effectively arrange the display section, the solar cell, and so on.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
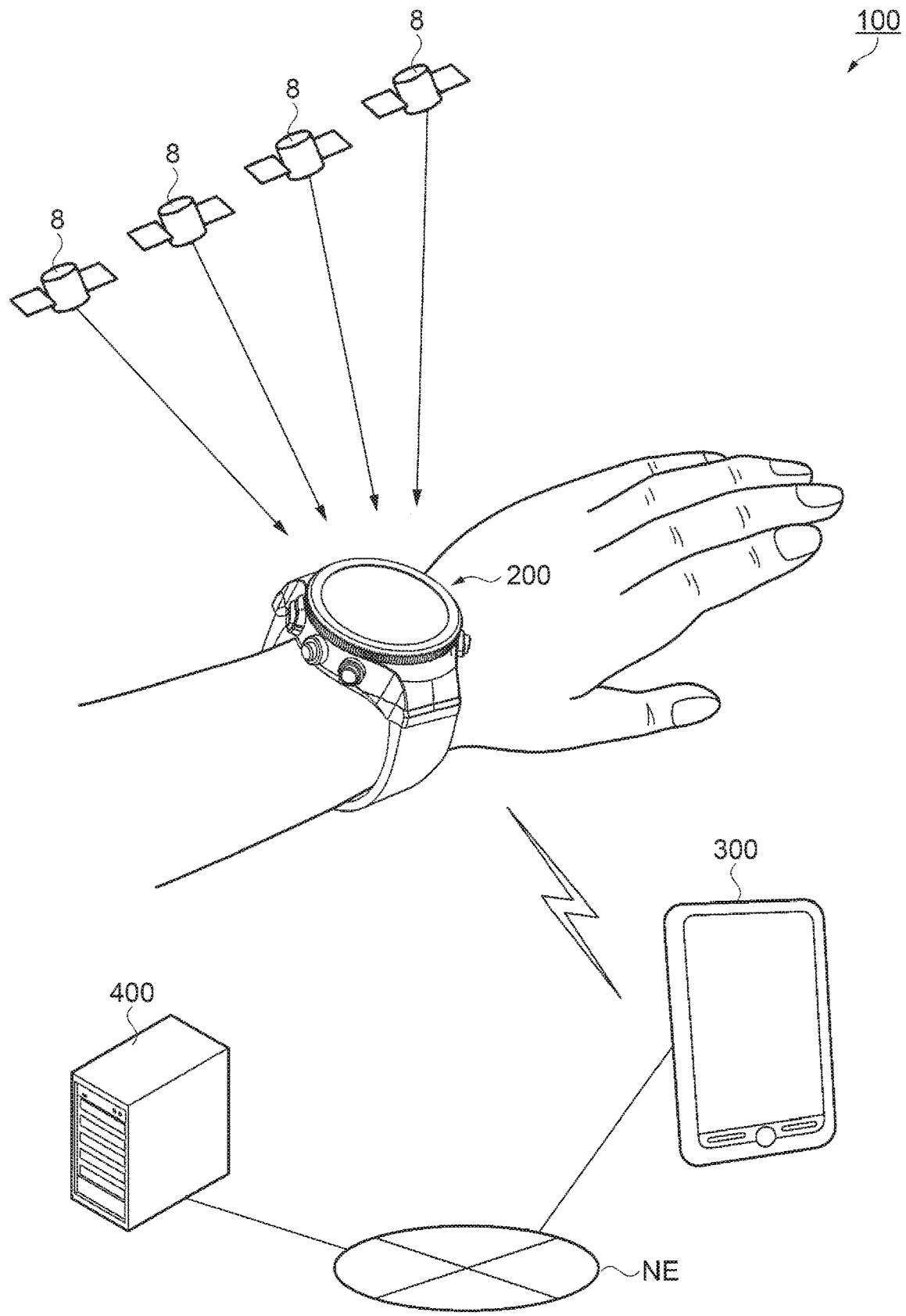
FIG. 1 is a schematic configuration diagram showing a brief overview of an exercise assistance system to which a wrist device as a portable electronic apparatus is applied.

Some embodiments of a system according to the invention will hereinafter be described. It should be noted that the embodiments described below do not unreasonably limit the contents of the invention as set forth in the appended claims. Further, all of the constituents described in each of the embodiments are not necessarily essential elements of the invention.

1. Method According to Present Embodiment

Firstly, an exercise assistance system as an example of a system to which the portable electronic apparatus according to the invention is applied will be described. The description will hereinafter be presented illustrating a wrist device (a wearable device) provided with a pulse wave sensor and a body motion sensor, and mounted on, for example, a wrist of the user as an example of the portable electronic apparatus.

The wrist device as the portable electronic apparatus used in the exercise assistance system is provided with a solar cell disposed on the display section side, and is provided with the pulse wave sensor for obtaining pulse wave information as biological information of the user, and the body motion sensor for obtaining motion information of the user. Further, the wrist device is provided with a GPS (Global Positioning System) as an example of a positioning system using a location information satellite called Global Navigation Satellite System (GNSS) or the like for obtaining the location information of the user. It should be noted that the portable electronic apparatus is not limited to the wrist device, but can also be a wearable device to be mounted on other regions of the user such as a neck region or an ankle region.

The pulse wave sensor as an example of the biological information measurement section is capable of obtaining the pulse wave information such as a pulse rate. As the pulse wave sensor, there is used, for example, a photoelectric sensor (a photosensor). In this case, it is possible to adopt a method of detecting the reflected light or the transmitted light of the light with which a living body is irradiated, using the photoelectric sensor. Since an amount of absorption and an amount of reflection of the light with which the living body is irradiated are different by the blood flow in the blood vessels, the sensor information detected by the photoelectric sensor becomes a signal corresponding to the blood flow or the like, and by analyzing the signal, it is possible to obtain the information related to the pulsation. It should be noted that the pulse wave sensor is not limited to the photoelectric sensor, and it is possible to use other sensors such as an electrocardiograph or an ultrasonic sensor.

It should be noted that the photoelectric sensor (the photosensor) is required to receive necessary light and block unwanted light, and in the example of the pulse wave sensor, it becomes necessary to receive the reflected light including the pulse wave component reflected by a test sample (in particular, a region including the blood vessels as the measurement object) as the object of the measurement, and block other light since other light acts as a noise component.

The body motion sensor is a sensor for detecting the body motion of the user. As the body motion sensor, it is conceivable to use an acceleration sensor, an angular velocity sensor, an orientation sensor (a geomagnetic sensor), a pressure sensor (an altitude sensor) or the like, but other sensors can also be used.

The GPS is also called Global Positioning System, and is a satellite positioning system for measuring the current location on the earth based on a plurality of satellite signals. The GPS is provided with a function of performing a positioning calculation using the GPS time information and orbital information to obtain the location information of the user, and a time correction function in the clock function.

2. Exercise Assistance System

Then, a configuration of the exercise assistance system to which the wrist device as the portable electronic apparatus is applied will be described with reference to FIG. 1. FIG. 1 is a schematic configuration diagram showing a brief overview of the exercise assistance system to which the wrist device as the portable electronic apparatus is applied.

As shown in FIG. 1, the exercise assistance system 100 according to the present embodiment includes the wrist device 200 as the portable electronic apparatus which is a detection device provided with a pulse wave sensor as the biological sensor (the photoelectric sensor), an acceleration sensor as a body motion sensor, the GPS, and so on, a portable device 300 as an exercise assistance device, and a server 400 as an information processing device connected to the portable device 300 via a network NE.

The GPS as the Global Navigation Satellite System provided to the wrist device 200 is provided with a function of receiving the radio waves (satellite signals) from GPS satellites 8 to correct the internal time, and perform the positioning calculation to obtain the location information. The GPS satellites 8 are an example of the location information satellites traveling on predetermined orbits above the earth, and each transmitting a high frequency radio wave superimposed with a navigation message to the ground. In the following description, the radio wave on which the navigation message is superimposed is referred to as a satellite signal.

The satellite signal from each of the GPS satellites 8 includes the extremely accurate GPS time information, and a time correction parameter for correcting the time error. It is possible for the wrist device 200 to receive the satellite signal (the radio wave) transmitted from one of the GPS satellites 8 to obtain the time information using the GPS time information and the time correction parameter included in the satellite signal.

Further, the satellite signal also includes the orbital information representing the position on the orbit of the GPS satellite 8. The wrist device 200 is capable of performing the positioning calculation using the GPS time information and the orbital information. The positioning calculation is performed on the assumption that the internal time of the wrist device 200 includes a certain amount of error. In other words, the time error becomes the unknown in addition to x, y, z parameters for identifying the three-dimensional position of the wrist device 200. Therefore, it is possible for the wrist device 200 to receive the satellite signals (the radio waves) respectively transmitted from, for example, three or more GPS satellites 8, then perform the positioning calculation using the GPS time information and the orbital information included in the satellite signals to obtain the location information at the present location.

The portable device 300 as the exercise assistance device can be constituted by, for example, a smartphone or a tablet-type terminal device. The portable device 300 is connected to the wrist device 200 using the pulse wave sensor as the biological sensor which is a photoelectric sensor, and the acceleration sensor as the body motion sensor with, for example, Near Field Communication such as Bluetooth (registered trademark), or wired communication (not shown). The portable device 300 is capable of receiving the measurement information from the wrist device 200, and then announcing the pulse wave information and the body motion information, the location information, or the like of the user thus processed. It should be noted that the portable device 300 can be provided with a variety of modifications in implementation such as inclusion of a photoelectric sensor section 40 and a body motion sensor section 170, a GPS receiving section 160, or the like included in the wrist device 200.

It should be noted that the wrist device 200 and the portable device 300 in the present embodiment each have the Bluetooth function, and the portable device 300 and the wrist device 200 are connected with the Bluetooth communication such as Bluetooth Low Energy (also referred to as Bluetooth 4.0). The Bluetooth Low Energy stresses a power saving property, and makes it possible to dramatically save the power consumption compared to the previous versions, and thus extend the available time of the wrist device.

Further, the portable device 300 can be connected to a server 400 such as a PC (personal computer) or a server system via the network NE. As the network NE mentioned here, there can be used a variety of types of network NE such as a WAN (Wide Area Network), a LAN (Local Area Network), a cellular phone communications network, or a Near Field Communication. In this case, the server 400 is realized as a process storage section for receiving the pulse wave information and the body motion information measured by the wrist device 200 and the data processed by the portable device 300 from the portable device 300 via the network NE, and then storing the information and the data thus received.

It should be noted that in the embodiment described above, it is sufficient for the wrist device 200 to be able to communicate with the portable device 300, and is not required to be directly connected to the network NE. Therefore, it becomes possible to simplify the configuration of the wrist device 200. It should be noted that in the exercise assistance system 100, it is also possible to adopt a modified implementation of omitting the portable device 300 to directly connect the wrist device 200 and the server 400 to each other. In this case, the wrist device 200 is provided with a function of processing the measurement information included in the portable device 300, and a function of transmitting the measurement information to the server 400 and receiving the information from the server 400.

Further, the exercise assistance system 100 is not limited to what is realized by a configuration including the server 400. For example, the process and the function realized by the exercise assistance system 100 can also be realized by the portable device 300. The portable device 300 such as a smartphone has limitations in processing performance, storage area, and battery capacity compared to the server system in many cases, but it is conceivable that it becomes possible to ensure a sufficient processing performance taking the improvement in performance in recent years into consideration. Therefore, as long as the requirement such as the processing performance is satisfied, it is possible for the portable device 300 alone to realize the process and the function realized by the exercise assistance system 100 according to the present embodiment.

Further, the exercise assistance system 100 according to the present embodiment is not limited to one realized by three devices. For example, the exercise assistance system 100 can also include two or more devices out of the wrist device 200, the portable device 300, and the server 400. In this case, the process performed by the exercise assistance system 100 can also be performed in either one of the devices, or can also be performed by a plurality of devices in a distributed manner. Further, it is also possible for the exercise assistance system 100 according to the present embodiment to include a different device from the wrist device 200, the portable device 300, and the server 400. Further, in the case of taking the improvement of the terminal performance, utilization form or the like into consideration, it is possible to achieve an embodiment in which the exercise assistance system 100 according to the present embodiment is realized by the wrist device 200.

Further, the exercise assistance system 100 according to the present embodiment includes a memory for storing the information (e.g., a program and a variety of types of data), and a processor operating based on the information stored in the memory. In the processor, for example, the functions of respective sections can each be realized by individual hardware, or the functions of the respective sections can also be realized by integrated hardware. The processor can also be, for example, a CPU (Central Processing Unit). It should be noted that the processor is not limited to the CPU, but it is also possible to use a variety of types of processors such as a GPU (Graphics Processing Unit) or a DSP (Digital Signal Processor). Further, the processor can also be a hardware circuit constituted by an ASIC. The memory can be a semiconductor memory such as an SRAM (Static Random Access Memory) or a DRAM (Dynamic Random Access Memory), or can also be a register, or can also be a magnetic storage device such as a hard disk drive, or can also be an optical storage device such as an optical disc drive. For example, the memory stores computer readable commands, and by the processor executing the commands, the functions of the respective sections of the exercise assistance system 100 are realized as a result. The commands here can also be commands constituting the program, or can also be commands for instructing the operation to the hardware circuit of the processor.

3. Wrist Device According to First Embodiment

Figure 2:
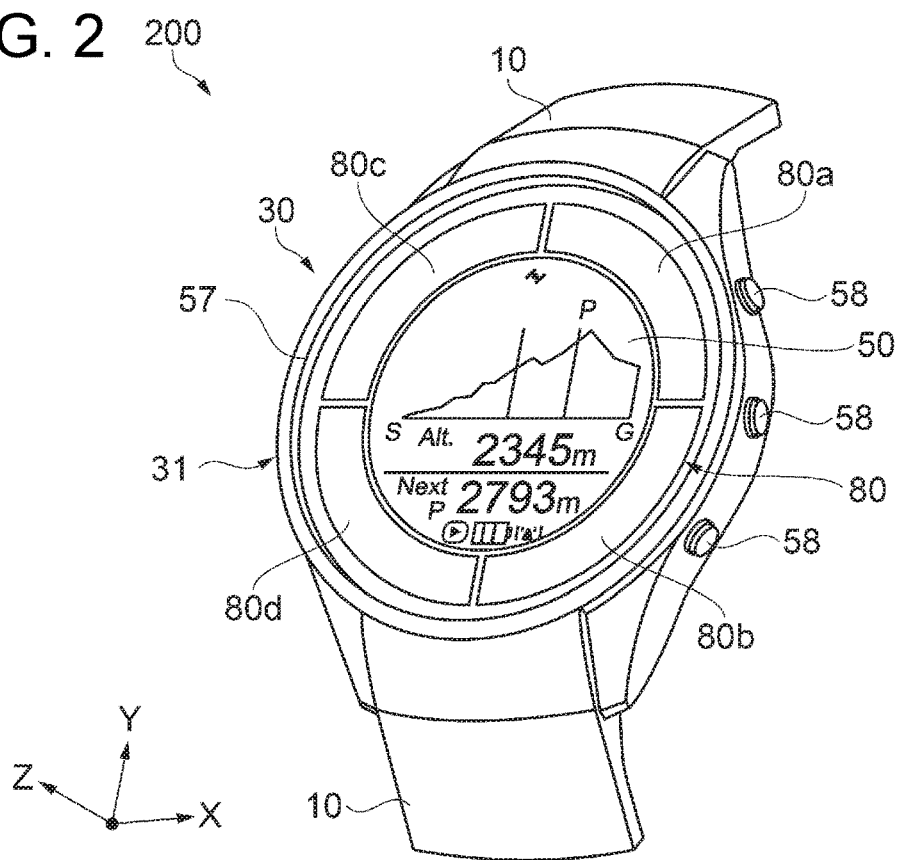
FIG. 2 is an external perspective view viewed from the obverse side (a display surface side) showing a schematic configuration of the wrist device according to a first embodiment of the invention.
Figure 3:
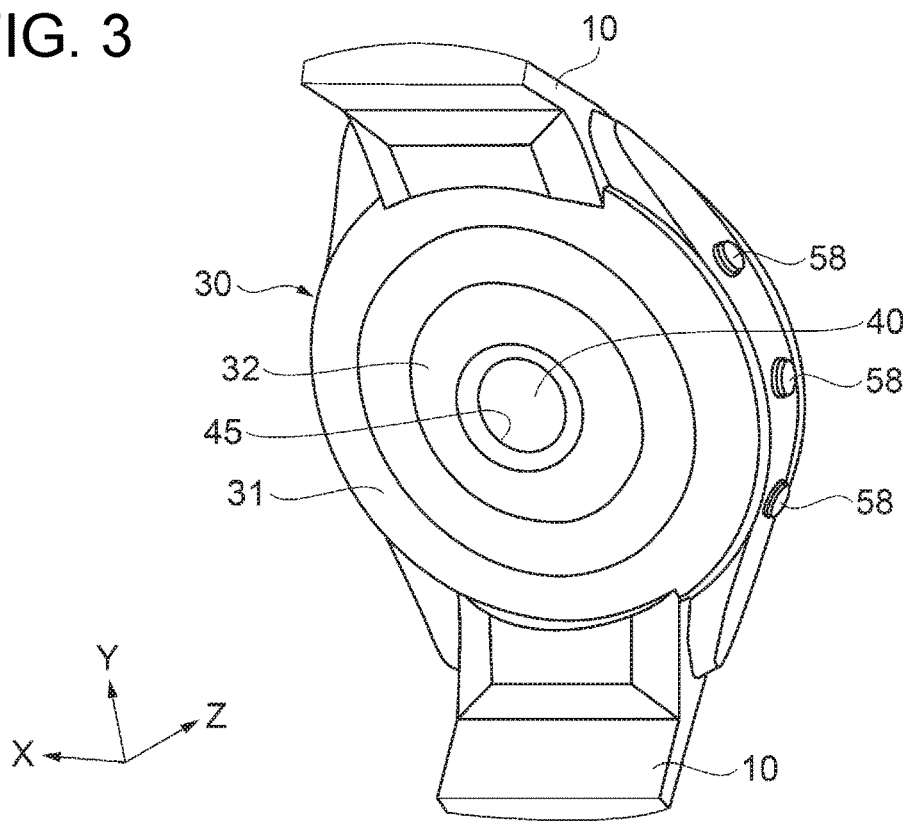
FIG. 3 is an external perspective view viewed from the reverse side showing the schematic configuration of the wrist device according to the first embodiment.
Figure 4:
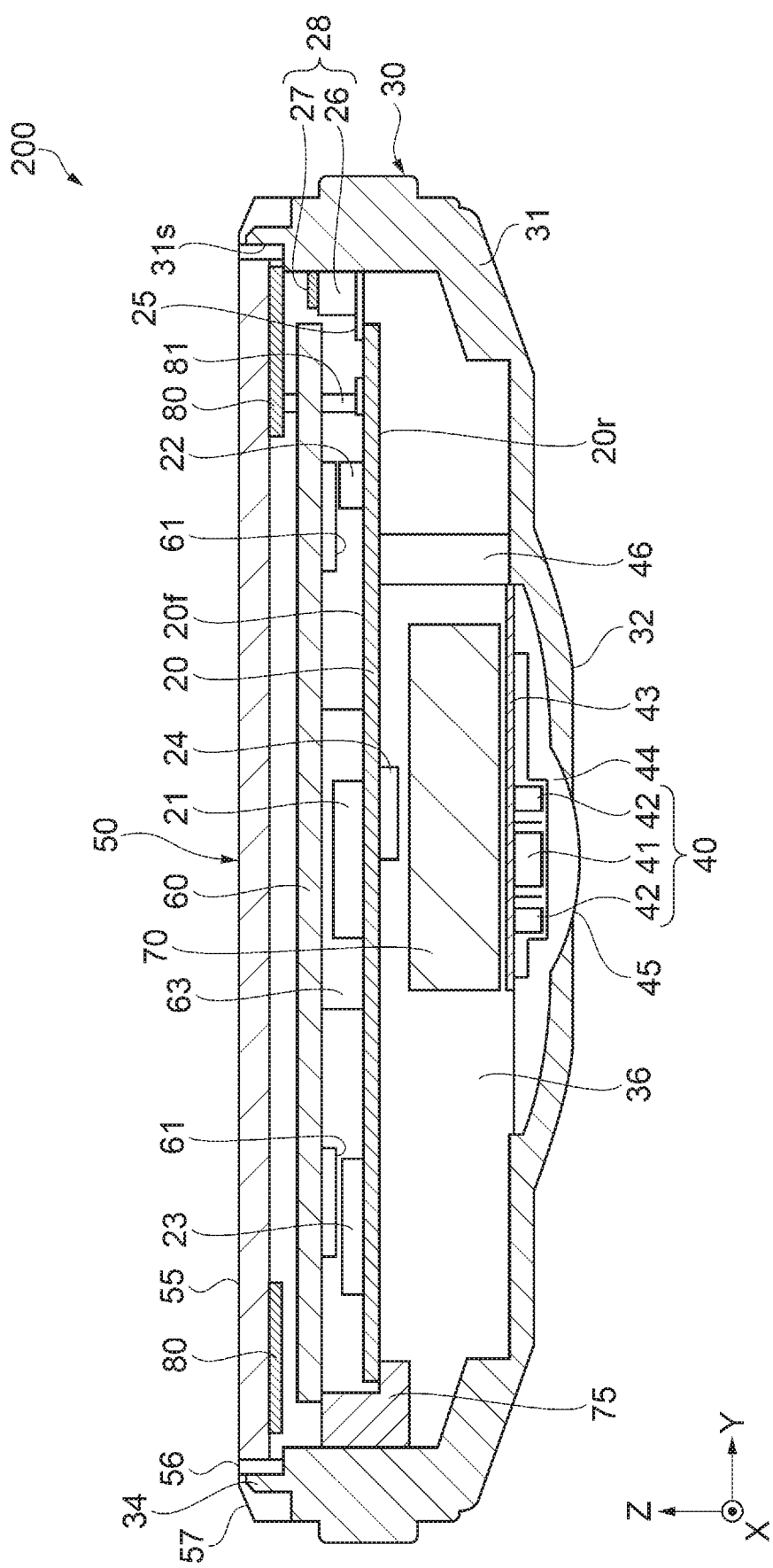
FIG. 4 is a cross-sectional view showing a configuration of the wrist device according to the first embodiment.
Figure 5:
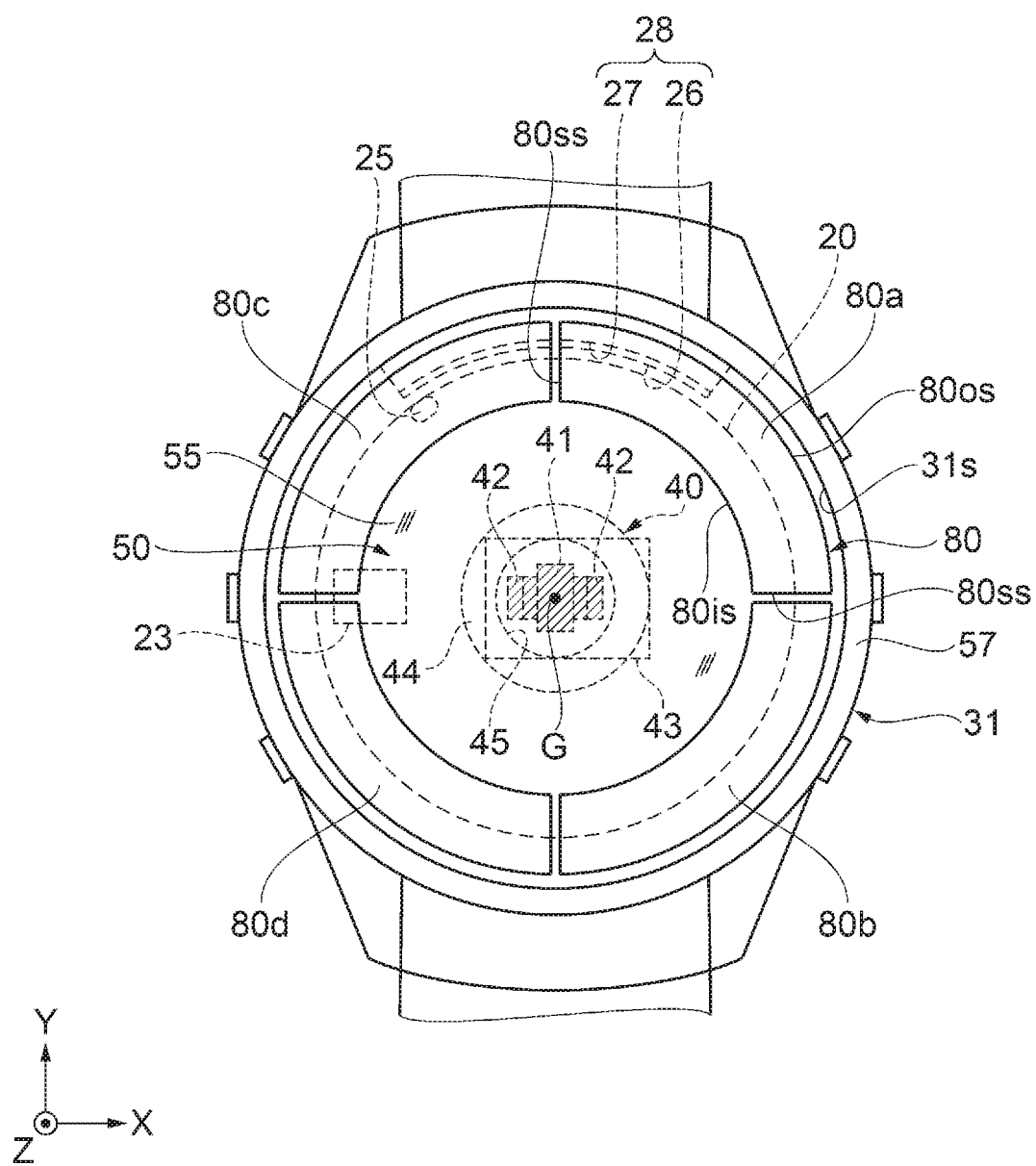
FIG. 5 is a plan view showing the configuration of the wrist device according to the first embodiment.
Figure 6:
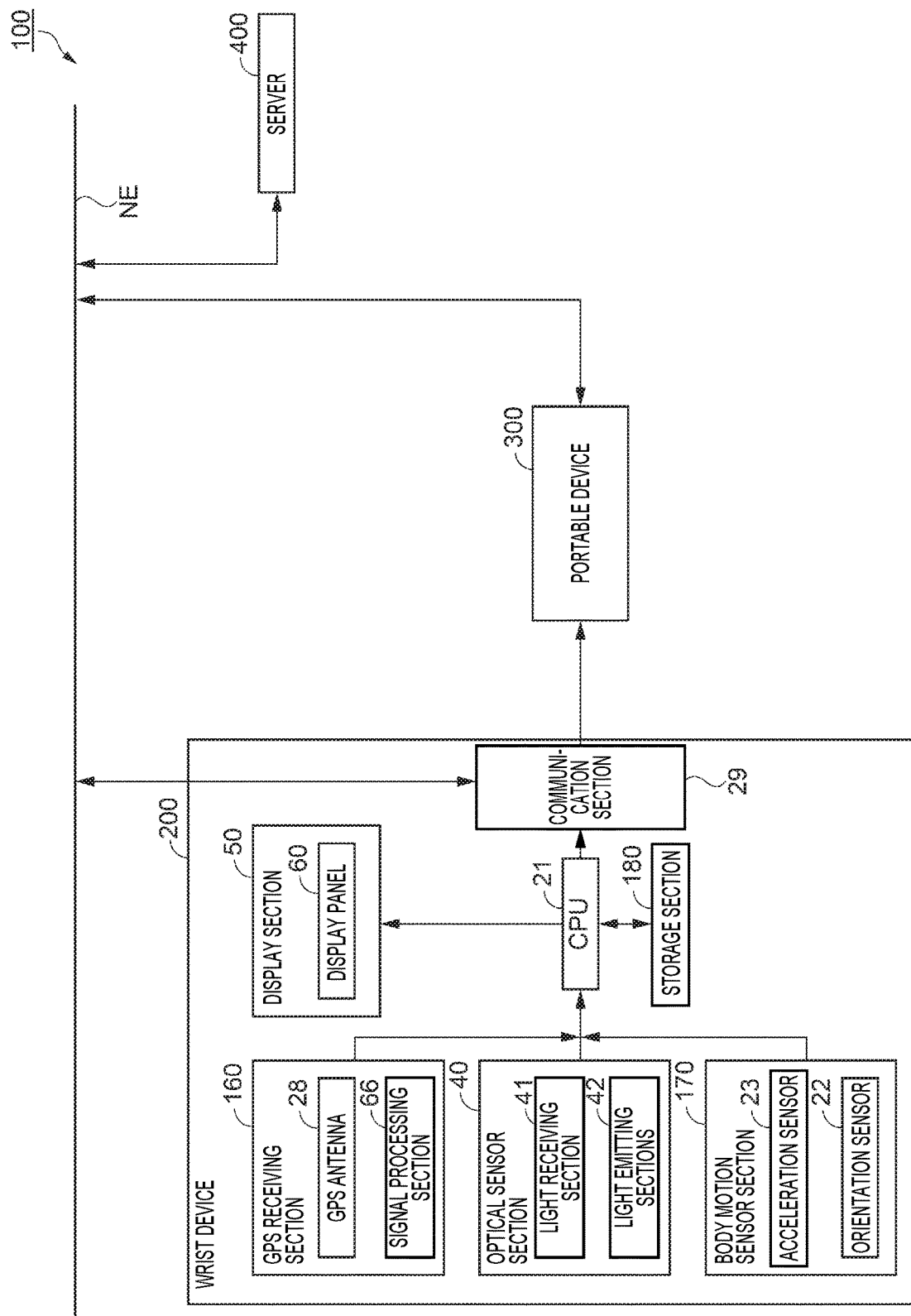
FIG. 6 is a functional block diagram showing a schematic configuration of the wrist device according to the first embodiment.
Figure 7:
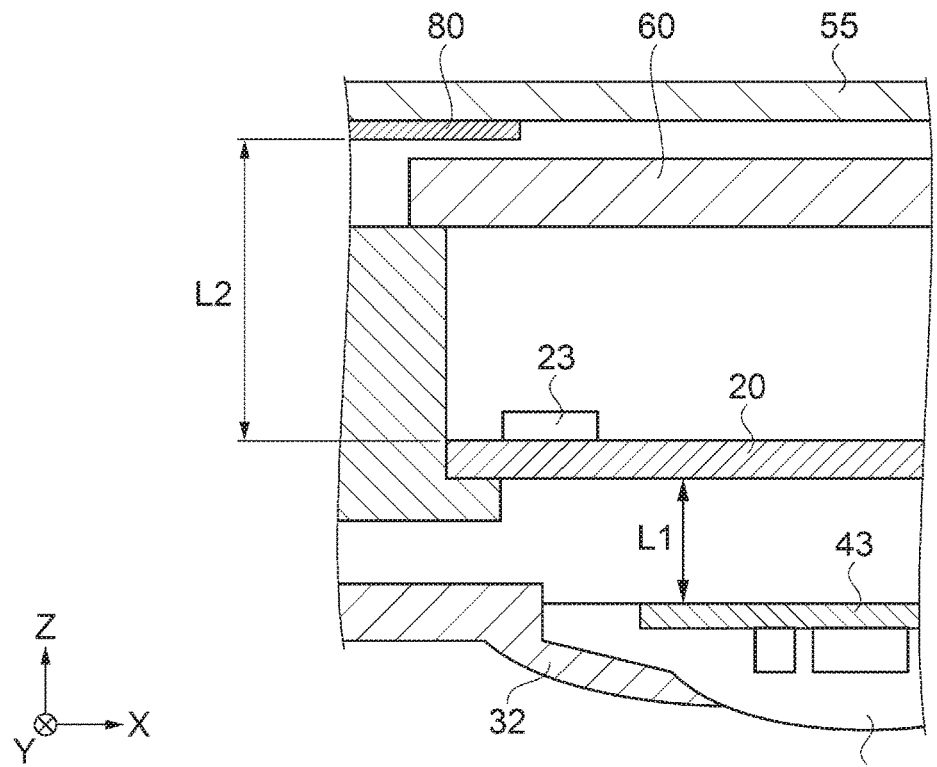
FIG. 7 is a partial cross-sectional view showing Arrangement Example 1 of the constituents of the wrist device according to the first embodiment.
Figure 8:
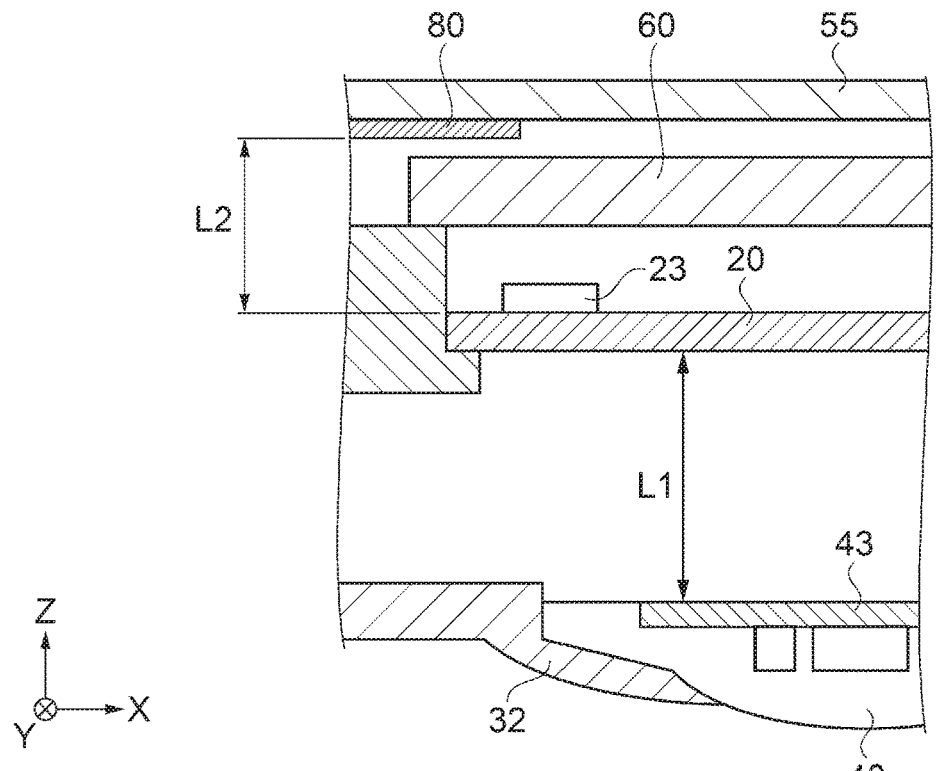
FIG. 8 is a partial cross-sectional view showing Arrangement Example 2 of the constituents of the wrist device according to the first embodiment.

Then, a configuration of the wrist device (a measurement device) as the portable electronic apparatus according to the first embodiment will be described with reference to FIG. 2, FIG. 3, FIG. 4, FIG. 5, FIG. 6, FIG. 7 and FIG. 8. FIG. 2 is an external perspective view viewed from the obverse side (a display surface side) showing a schematic configuration of the wrist device according to the first embodiment. FIG. 3 is an external perspective view viewed from the reverse side showing the schematic configuration of the wrist device according to the first embodiment. FIG. 4 is a cross-sectional view showing a configuration of the wrist device according to the first embodiment. FIG. 5 is a plan view showing the configuration of the wrist device according to the first embodiment. FIG. 6 is a functional block diagram showing a schematic configuration of the wrist device according to the first embodiment. FIG. 7 is a partial cross-sectional view showing Arrangement Example 1 of the constituents of the wrist device according to the first embodiment. FIG. 8 is a partial cross-sectional view showing Arrangement Example 2 of the constituents of the wrist device according to the first embodiment.

It should be noted that in the following description of the wrist device 200 according to the first embodiment, the description will be presented defining the side located on the object side to be the objective region of the measurement of the biological information and so on when mounting the device main body 30 on the user as "reverse side or reverse surface side," and the display surface side of the device main body 30 to be the opposite side of the reverse side as "obverse side or obverse surface side." Further, the "object (objective region)" to be measured is referred to as a "test sample" in some cases. Further, a coordinate system is set based on a case 31 of the wrist device 200, the center of the display surface of a display section 50 is defined as an origin, and the direction crossing the display surface of the display section 50 from the reverse surface toward the obverse surface in the case of defining the display surface side of the display section 50 as the obverse surface is defined as a Z-axis positive direction (+Z-axis direction). Alternatively, the direction from the photoelectric sensor section 40 toward the display section 50, or the direction of getting away from the case 31 in the normal direction of light receiving surfaces 80*a*, 80*b*, 80*c*, and 80*d* of panels constituting the solar cell 80 can also be defined as the Z-axis positive direction. In the state in which the wrist device 200 is mounted on the test sample, the Z-axis positive direction described above corresponds to the direction from the test sample toward the case 31. Further, the two axes perpendicular to the Z axis are defined as X, Y axes, and in particular, the direction in which the band sections 10 are attached to the case 31 is set as the Y axis. It should be noted that the light receiving surfaces 80*a*, 80*b*, 80*c*, and 80*d* are surfaces through which the light enters the solar cell 80.

FIG. 2 is a perspective view of the wrist device 200 in the state in which the band sections 10 are fixed viewed from the +Z-axis direction corresponding to the obverse side (the display section 50 side) opposite to the reverse side corresponding to the test sample side in the mounted state. Further, FIG. 3 is a perspective view viewed from the −Z-axis direction corresponding to the reverse side opposite to the side shown in FIG. 2. Further, FIG. 4 is a cross-sectional view viewed from the +Y-axis direction. Further, FIG. 5 is a plan view viewed from the +Z-axis direction.

The wrist device 200 as the portable electronic apparatus is mounted on a predetermined region (the objective region of the measurement such as a wrist) of the user as shown in FIG. 2, FIG. 3 and FIG. 4, and detects the pulse wave information, the body motion information, the location information, and so on. The wrist device 200 has the device main body 30 including the case 31 and made to adhere to the user to detect the pulse wave information, the body motion information and so on, and the pair of band sections 10 attached to the device main body 30 to mount the device main body 30 on the user.

The device main body 30 including the case 31 is provided with the display section 50, the solar cell 80 having an annular shape including the light receiving surfaces 80a, 80b, 80c and 80d of the panels facing to the +Z-axis direction disposed in the outer edge part of the display section 50, and a measurement window section 45 corresponding to the photoelectric sensor section 40 (see FIG. 4) as a biological information measurement section. It should be noted that it is also possible to arrange the display section 50 and a part of the solar cell 80 so as to overlap each other in the planar view from the +Z-axis direction (the normal direction of the light receiving surfaces 80a, 80b, 80c and 80d). Further, on outer side surfaces of the device main body 30, there is disposed a plurality of operation sections (operation buttons) 58, and a bezel 57 arranged so as to circularly surround the outer edge of the display section 50 is disposed. It should be noted that the wrist device 200 is not limited to such a configuration, but a variety of modified implementations such as elimination of some of the constituents or addition of other constituents can be adopted.

The device main body 30 has the case 31 provided with an opening section 31s opening on the obverse side. On the reverse side of the case 31, there is disposed the measurement window section 45 of the photoelectric sensor section 40 in the top part of a convex part 32 projecting from the reverse surface as the surface on the reverse side of the case 31. Further, the photoelectric sensor section 40 as the biological information measurement section is disposed at the position corresponding to the measurement window section 45 in the planar view viewed from the +Z-axis direction, and a transparent cover 44 is inserted into the measurement window section 45. It should be noted that the transparent cover 44 can also protrude from the top part of the convex part 32. Further, in the planar view viewed from the +Z-axis direction, the measurement window section 45 is preferably disposed at a position where the measurement window section 45 does not overlap the solar cell 80. As described above, since the measurement window section 45 of the photoelectric sensor section 40 is disposed at the position where the measurement window section 45 does not overlap the solar cell 80, the distance from the outer peripheral edge of the case 31 to the photoelectric sensor section 40 becomes long to make the outside light difficult to reach the measurement window section 45, and thus, it is possible to prevent the outside light from entering the measurement window section 45, and thus, it is possible to prevent the detection accuracy of the photoelectric sensor section 40 from degrading.

It should be noted that the case 31 can be formed of metal such as stainless steel, resin, or the like. It should be noted that the configuration of the case 31 is not limited to the integrated body, but can also be a configuration in which the case 31 is divided into a plurality of regions such as the case 31 having a two-body structure in which a back lid is disposed on the side on which the case 31 is mounted on the user.

In the device main body 30, the bezel 57 is disposed on the outer circumference side of a projecting part 34 erected so as to project toward the +Z-axis direction in the outer edge of the opening section 31s of the case 31 located on the obverse side of the device main body 30, and at the same time, a windshield plate (a glass plate in this example) 55, which is a transparent plate as a top plate part for protecting the internal structure, is disposed inside the bezel 57. The windshield plate 55 is disposed so as to close the opening of the case 31 in a planar view viewed from a direction of facing right to the light receiving surfaces 80a, 80b, 80c, and 80d of the solar cell 80, in other words, the +Z-axis direction. The windshield plate 55 is attached to the inner edge side of the projecting part 34 of the case 31 with a bonding member 56 such as a packing or an adhesive. Further, an internal space 36 as a closed space is disposed in the inside of the case 31 surrounded by the case 31 and the windshield plate 55 for closing the opening of the case 31.

It should be noted that the windshield plate 55 is not limited to the glass plate, but can also be formed of other materials than glass such as transparent plastic providing the materials have such strength as to protect the constituents housed in the internal space 36 such as a liquid crystal display (a display panel 60) constituting the display section 50.

Further, as shown in FIG. 4, in the internal space 36 inside the case 31, there are housed, for example, a circuit board 20, an orientation sensor 22 and an acceleration sensor 23 as sensors included in the body motion sensor section 170 (see FIG. 6), a GPS antenna 28 as an antenna section, the photoelectric sensor section 40, the liquid crystal display (hereinafter referred to as the display panel 60) constituting the display section 50, an illumination section 61 for the display panel 60, a secondary cell 70 (a lithium secondary cell), and the solar cell 80 as the constituents of the wrist device 200. It should be noted that the device main body 30 is not limited to the configuration shown in FIG. 4, but it is possible to add other sensors such as a barometric sensor for calculating the altitude or a temperature sensor for measuring the temperature, a vibrator, and so on. Further, to the circuit board 20, there are connected connection wiring to the constituents described above, a CPU (Central Processing Unit) 21 as a processing section (processor), and other circuit elements 24, wherein the processing section includes a control circuit including a control circuit for controlling a variety of sensors and the display section 50 constituting the wrist device 200, a drive circuit, and so on. It should be noted that the CPU 21 as the processing section is electrically connected to the variety of sensors such as the photoelectric sensor section 40 and the acceleration sensor 23, and is capable of processing the signals detected by the respective sensors. Further, the CPU 21 is electrically connected to the display panel 60 constituting the display section 50, and is capable of controlling display of the display panel 60. Further, it is also possible to connect the orientation sensor 22 and the acceleration sensor 23 to the circuit board 20.

Out of the constituents of the wrist device 200 disposed in the internal space 36, the circuit board 20, the photoelectric sensor section 40, the display panel 60, the secondary cell 70 and the solar cell 80 are disposed in a direction from the windshield plate 55 side toward the −Z-axis direction in the order of the solar cell 80, the display panel 60, the circuit board 20, the secondary cell 70 and the photoelectric sensor section 40. It should be noted that the solar cell 80 is disposed so as to cover at least a part of the display section 50.

By disposing the display panel 60 constituting the display section 50 between the solar cell 80 and the circuit board 20 in the case 31 as described above, it is possible for the user to visually recognize the display of the display section 50 with ease without being shaded by the circuit board 20.

Further, it is preferable for the outer circumferential end part of the display panel 60 electrically connected to the CPU 21 to be disposed between the outer circumference 80os as the outer edge part shaped like a circle of the solar cell 80 described later and the inner circumference 80is shaped like a circle as the inner edge part in a planar view viewed from the +Z-axis direction. By disposing the outer circumferential end part of the display panel 60 between the outer circumference 80os and the inner circumference 80is of the solar cell 80, in other words, by overlapping the outer circumferential end part of the display panel 60 with the solar cell 80 as described above, in the planar view viewed from the +Z-axis direction, it is possible to improve the arrangement balance between the solar cell 80 and the display section 50 (the display panel 60), and it is possible to ensure the large area of the solar cell 80 while keeping the area of the display section 50. Further, by disposing the end part of the display section 50 so as to be covered with the solar cell 80, the end part of the display section 50 can be concealed, and thus the sensuousness can be improved.

Further, by disposing the display panel 60 constituting the display section 50 between the solar cell 80 and the photoelectric sensor section 40 in the inside of the case 31, it is possible for the display panel 60 to shade the so-called stray light which is the light incoming toward the solar cell 80 for generating electric power, and then entering the case 31 from the solar cell 80 side as leakage light entering through a gap or the like, and thus, it is possible to reduce the influence of the outside light (the stray light) on the photoelectric sensor section 40.

Further, by disposing the secondary cell 70 between the display section 50 and the photoelectric sensor section 40 in the inside of the case 31, it is possible for the secondary cell 70 to shade the stray light which is the light incoming for generating the electric power and then entering the case 31 from the solar cell 80 side, and thus, it is possible to reduce the influence of the outside light on the photoelectric sensor section 40.

The GPS antenna 28 as the antenna section for receiving the positioning satellite signals includes a base 26 formed of, for example, a resin member as a nonconductive member, and a conductive body 27 formed of metal such as copper, a copper alloy, aluminum, or an aluminum alloy and disposed on the surface located on the windshield plate 55 side (the +Z-axis direction) of the base 26. As shown in FIG. 5, the base 26 is disposed so as to curve along the inner circumference of the opening section 31s of the case 31 in the 12-o'clock direction (the +Y-axis direction), and is disposed so as to overlap the solar cell 80 in a planar view viewed from the normal direction (the +Z-axis direction) of the light receiving surfaces 80a, 80b, 80c and 80d of the solar cell 80. In the GPS antenna 28, by using the base 26 having the nonconductive property as a dielectric body to use the wavelength shortening effect due to the base 26 (the dielectric body), the antenna is constituted. Since such an antenna can compactly be configured with the base 26 and the conductive body 27 disposed on the surface of the base 26, it is possible to miniaturize the GPS antenna 28.

It should be noted that the GPS antenna 28 is preferably disposed on the outer side (on the outer circumference side of the case 31) of the contour of the display section 50, in other words, the inner circumference 80is of the solar cell 80 described later in the planar view viewed from the +Z-axis direction. By disposing the GPS antenna 28 on the outer circumference side of the case 31 as described above, it is possible to increase the degree of freedom of the arrangement layout of the display section 50, the solar cell 80, and so on, and thus, it is possible to more effectively arrange the display section 50, the solar cell 80, and so on.

Further, in the planar view viewed from the +Z-axis direction, it is preferable to dispose at least a part of the base 26 so as to overlap the solar cell 80 (the light receiving surfaces 80a, 80b, 80c, and 80d). By adopting such an arrangement, it is possible to improve the receiving sensitivity of the GPS antenna 28 due to the capacitive coupling between the base 26 and the solar cell 80.

Further, it is preferable for the GPS antenna 28 to be disposed between the solar cell 80 and the circuit board 20 in a cross-sectional view viewed from a direction (the X-axis direction) perpendicular to the normal direction (the +Z-axis direction) of the light receiving surfaces 80a, 80b, 80c, and 80d of the solar cell 80. By adopting such an arrangement, it is possible to use the wavelength shortening effect by using the circuit board 20 as the dielectric body in addition to the base 26, and thus, it is possible to make the GPS antenna 28 more compact (smaller in size). Further, due to the capacitive coupling between the GPS antenna 28 and the circuit board 20, it is possible to improve the receiving sensitivity of the GPS antenna 28.

Further, the GPS antenna 28 is electrically connected to the CPU 21 as the processing section supported by the circuit board 20 via a connection section 25 as a contact point supported by the circuit board 20 in the conductive body 27. Due to such connection, the electrical connection between the CPU 21 and the GPS antenna 28 as a separate member can compactly be achieved on the circuit board 20. Further, it is preferable for the connection section 25 as the contact point to be disposed so as to overlap the solar cell 80 in the planar view viewed from the +Z-axis direction. By disposing the connection section 25 so as to overlap the solar cell 80 in the planar view viewed from the +Z-axis direction, it is possible to increase the degree of freedom of the arrangement layout of the GPS antenna 28 and the CPU 21, and at the same time, achieve the compact arrangement. Further, it is possible to increase the light receiving area of the solar cell 80 without affecting the receiving sensitivity of the GPS antenna 28, and thus, it is possible to increase the production of electricity in the solar cell 80.

Further, the conductive body 27 is not required to be disposed on the entire area of the obverse surface located on the windshield plate 55 side (the +Z-axis direction) of the base 26, but is sufficient to be disposed at least a part of the surface. Further, it is also possible for the conductive body 27 to be disposed on the side surface or the reverse surface in addition to the obverse surface located on the windshield plate 55 side (the +Z-axis direction) of the base 26.

Further, as shown in FIG. 7, it is preferable for the circuit board 20, the photoelectric sensor section 40, and the solar cell 80 to have an arrangement in which the distance L2 (the shortest distance between the circuit board 20 and the solar cell 80) between the circuit board 20 and the solar cell 80 becomes longer than the distance L1 (the shortest distance between the circuit board 20 and the photoelectric sensor section 40) between the circuit board 20 and the photoelectric sensor section 40 in a cross-sectional view viewed from the −Y-axis direction as a direction perpendicular to the +Z-axis direction (the normal direction of the light receiving surfaces 80*a*, 80*b*, 80*c*, and 80*d*). By making the distance L2 between the circuit board 20 and the solar cell 80 longer as described above, it becomes difficult for the solar cell 80 to be affected by the heat generation of the circuit board 20 or other constituents. Therefore, the rise in temperature of the solar cell 80 can be suppressed, and thus, the deterioration of the power generation efficiency in the solar cell 80 can be prevented.

Further, as shown in FIG. 8, it is also possible for the circuit board 20, the photoelectric sensor section 40, and the solar cell 80 to have an arrangement in which the distance L2 (the shortest distance between the circuit board 20 and the solar cell 80) between the circuit board 20 and the solar cell 80 becomes shorter than the distance L1 (the shortest distance between the circuit board 20 and the photoelectric sensor section 40) between the circuit board 20 and the photoelectric sensor section 40 in a cross-sectional view viewed from the −Y-axis direction as a direction perpendicular to the +Z-axis direction (the normal direction of the light receiving surfaces 80*a*, 80*b*, 80*c*, and 80*d*). By making the distance L2 between the circuit board 20 and the solar cell 80 shorter as described above, it is possible to suppress the transmission loss of the electric power generated in the solar cell 80 to improve the charging efficiency.

Further, by disposing the circuit board 20 between the solar cell 80 and the photoelectric sensor section 40 in the inside of the case 31, it is possible for the circuit board 20 to shade the so-called stray light which is the light incoming toward the solar cell 80 for generating the electric power, then entering the case 31 from the solar cell 80 side as leakage light entering through a gap or the like, and thus, it is possible to reduce the influence of the outside light (the stray light) on the photoelectric sensor section 40.

The constituents of the wrist device 200 according to the first embodiment will hereinafter be described in further detail with reference also to the functional block diagram shown in FIG. 6.

The circuit board 20 includes an obverse surface 20*f* (a first surface), and a reverse surface 20*r* (a second surface) which is a surface different from the obverse surface 20*f*, and is a surface on the opposite side to the obverse surface 20*f*. An end part on the outer circumference side of the circuit board 20 is attached to a circuit case 75 as a circuit fixation section, and thus, the circuit board 20 is supported inside the case 31 via the circuit case 75. On the obverse surface 20*f* of the circuit board 20, there are mounted the orientation sensor 22 and the acceleration sensor 23 as the sensors included in the body motion sensor section 170, the CPU 21 as the control circuit, and so on, and on the reverse surface 20*r*, there are mounted other circuit elements 24 and so on, wherein the constituents are electrically connected to each other. Since the circuit board 20 is supported by the case 31 on the outer circumference side of the circuit board 20 as described above, it is easy for the vibration from the case 31 to propagate to the acceleration sensor 23 connected to the circuit board 20, and it is possible to further improve the detection accuracy of tapping detection by the acceleration sensor 23. Further, in an end part of the obverse surface 20*f* of the circuit board 20, there is supported (connected) the connection section 25 as the contact point for electrically connecting the GPS antenna 28 and the CPU 21 to each other.

Further, the display panel 60 and the solar cell 80 are connected to the obverse surface 20*f* of the circuit board 20 respectively via a connection wiring section 63 and a connection wiring section 81 each formed of a flexible board or the like. Further, the photoelectric sensor section 40 is electrically connected to the reverse surface 20*r* of the circuit board 20 as a surface on the opposite side to the obverse surface 20*f* via a connection wiring section 46 formed of a flexible board or the like. By adopting such an arrangement, it is possible to minimize the laying of the wiring for the connection, and at the same time shade the stray light which is the light incoming for generating the electric power and entering the case as the leakage light from the solar cell 80 side using the circuit board 20, and thus, it is possible to reduce the influence of the outside light on the photoelectric sensor section 40. It should be noted that the circuit case 75 can guide the secondary cell 70 and so on.

The orientation sensor (the geomagnetic sensor) 22 and the acceleration sensor 23 included in the body motion sensor section 170 are capable of detecting the information related to the motion of the body of the user, namely the body motion information. The orientation sensor (the geomagnetic sensor) 22 and the acceleration sensor 23 each output a body motion detection signal as a signal varying in accordance with the body motion such as a displacement or a change in direction of the user, and then transmit the body motion detection signal to the CPU 21 as the processing section including the control circuit. It should be noted that in addition to the detection related to the motion such as a displacement of the user, the acceleration sensor 23 is also capable of detecting a so-called tapping motion for achieving indication of intention of the operation by applying a light impact to the case 31 using, for example, a motion of tapping the outer circumferential part of the case 31, the windshield plate 55 or the like by the user with a fingertip.

Further, as shown in FIG. 5, it is preferable for the acceleration sensor 23 to be disposed at the position where at least a part of the acceleration sensor 23 overlaps the solar cell 80 in the planar view viewed from the +Z-axis direction. In other words, it is preferable for the acceleration sensor 23 to be mounted, therefore, at a position close to the outer circumference side of the circuit board 20, in other words, to the inner wall (inner circumference) of the case. Alternatively, it is preferable for the acceleration sensor 23 to be disposed at the position where the distance between the region where the circuit case 75 has contact with the circuit board 20 and the center of the acceleration sensor 23 is shorter than the distance between the center of the acceleration sensor 23 and the center of the circuit board 20 as shown in FIG. 4. By disposing the acceleration sensor 23 as described above, it becomes easy for the impact such as the tapping motion received by the case 31 to propagate to the acceleration sensor 23 via the circuit board 20 supported by the case 31 on the outer circumference side of the circuit board 20, and it is possible to further improve the detection accuracy by the acceleration sensor 23.

The CPU 21 as the processing section constitutes a circuit for controlling the GPS receiving section 160 including the GPS antenna 28, a circuit for driving the photoelectric sensor section 40 to measure the pulse wave, a circuit for driving the display section 50 (the display panel 60), a circuit for driving the body motion sensor section 170 and processing the signal detected to obtain the body motion information, a control circuit for controlling a power generation circuit in the solar cell 80, and so on. Further, the CPU 21 transmits the pulse wave information, the body motion information, the location information of the user, and so on detected in the respective regions to a communication section 29 as needed.

The GPS antenna 28 is included in the GPS receiving section 160 together with a signal processing section 66, and receives the plurality of satellite signals. The signal processing section 66 performs the positioning calculation based on the plurality of satellite signals received by the GPS antenna 28 to obtain the result as the location information of the user.

The communication section 29 transmits the pulse wave information, the body motion information, and the location information of the user transmitted from the CPU 21 to the portable device 300, and so on as needed.

The photoelectric sensor section 40 as the biological information measurement section is for detecting the pulse wave and so on, and includes a light receiving section 41 and a plurality of (two in the present embodiment) light emitting sections 42 disposed on both sides of the light receiving section 41, in other words, on the outer sides (the outer circumference sides of the case 31) of the light receiving section 41 in a planar view. By disposing the light receiving section 41 on the inner side of the light emitting sections 42 as described above, it is possible to prevent the outside light incoming from the outer circumference side of the case 31 from entering the light receiving section 41, and thus, it is possible to reduce the influence of the outside light on the photoelectric sensor section 40. It should be noted that the number of the light emitting sections 42 is not limited to two, but can also be one, three, or more. The light receiving section 41 and the two light emitting sections 42 are attached to one surface of a sensor substrate 43, and are covered with the transparent cover 44 formed of a member which is formed of, for example, light curing resin, and transmits light. The transparent cover 44 has apart including an area corresponding to the light receiving section 41 and the two light emitting sections 42, and the part of the transparent cover 44 is inserted into the measurement window section 45 provided to the case 31. It should be noted that the transparent cover 44 can also protrude from the top part of the convex part 32 of the case 31.

In the photoelectric sensor section 40, by irradiating the test sample (the object of the measurement) with the light emitted from the light emitting sections 42 as described above, and receiving the reflected light therefrom with the light receiving section 41, it is possible to detect the pulse wave information. The photoelectric sensor section 40 outputs the signal detected by the pulse wave sensor including the light emitting sections 42 and the light receiving section 41 as a pulse wave detection signal. As the photoelectric sensor section 40, there is used, for example, a photoelectric sensor. In this case, it is possible to adopt a method of detecting the reflected light or the transmitted light of the light with which the living body (the wrist of the user) is irradiated by the light emitting sections 42, using the light receiving section 41. According to such a method as described above, since an amount of absorption and an amount of reflection of the light with which the living body is irradiated are different by the blood flow in the blood vessels, the sensor information detected by the photoelectric sensor becomes a signal corresponding to the blood flow or the like, and by analyzing the signal, it is possible to obtain the information related to the pulsation. It should be noted that the pulse wave sensor is not limited to the photoelectric sensor, and it is possible to use other sensors such as an electrocardiograph or an ultrasonic sensor.

Further, the photoelectric sensor section 40 is disposed at a position where the photoelectric sensor section 40 does not overlap the solar cell 80 formed to have an annular shape in the planar view viewed from the direction (+Z-axis direction) facing right to the light receiving surfaces 80a, 80b, 80c, and 80d of the solar cell 80 as shown in FIG. 5. In other words, the solar cell 80 is disposed on the outer side of the outer edge of the photoelectric sensor section 40, and is disposed at a position where the solar cell 80 and the photoelectric sensor section 40 do not overlap each other in the planar view viewed from +Z-axis direction. Instill other words, the solar cell 80 is disposed between the bezel 57 and the photoelectric sensor section 40 in the planar view viewed from the +Z-axis direction. Here, the outer edge of the photoelectric sensor section 40 preferably denotes the outer edge of the area indicated by oblique hatching in FIG. 5, including the outer edges of at least the light receiving section 41 and the two light emitting sections 42, and connecting the respective outer edges to each other. It should be noted that in the present embodiment, it is possible to define the outer edge of the measurement window section 45 including the light receiving section 41 and the two light emitting sections 42 as the outer edge of the photoelectric sensor section 40. Further, it is also possible to define the outer edge of the sensor substrate 43 as the outer edge of the photoelectric sensor section 40. Further, it is also possible to define the outer edge of the transparent cover 44 as the outer edge of the photoelectric sensor section 40.

It results that the solar cell 80 disposed to have the annular shape is disposed on the outer side of the outer edge of the photoelectric sensor section 40 so as to surround the photoelectric sensor section 40 in the planar view viewed from +Z-axis direction, in other words, the photoelectric sensor section 40 is disposed at a central part of the case 31 in the planar view, or the distance from the photoelectric sensor section 40 to the inner wall (inner circumference) of the case 31 is longer than the distance from the outer circumference 80os of the solar cell to the inner wall (the inner circumference) of the case 31, and thus, it is possible to suppress the influence of the outside light (the leakage light) in the photoelectric sensor section 40. Thus, since it is possible to dispose the solar cell 80 without deteriorating the detection accuracy of the photoelectric sensor section 40, it is possible to achieve both of the detection accuracy of the biological information by the photoelectric sensor section 40 and the efficient electric power generation by the solar cell 80. Further, since the solar cell 80 is disposed on the outer side of the outer edge of the photoelectric sensor section 40 in the planar view, the arrangement balance for making it easy to perform the detection by the photoelectric sensor section 40 while efficiently performing the electric power generation in the solar cell 80 is improved, and it is possible to improve the mountability of the device main body 30 of the wrist device 200 to the user. Further, it is also possible to define the outer edge of the transparent cover 44 as the outer edge of the photoelectric sensor section 40. It should be noted that the expression of "not overlap" described above denotes the state in which S=0 is true defining the area where the solar cell 80 and the photoelectric sensor section 40 overlap each other in the planar view viewed from the +Z-axis direction as S. Further, the expression that the photoelectric sensor section 40 is surrounded by the solar cell 80 can include the case in which the photoelectric sensor section 40 is surrounded by a plurality of solar cells 80, and it is also possible to include the case in which the solar cell 80 is divided, or the case in which a cut is provided. Here, the case in which a concentric circle is drawn with respect to the centroid of the photoelectric sensor section 40 in the planar view viewed from the +Z-axis direction and the proportion of the overlap between the concentric circle and the solar cell 80 to the circumference of the concentric circle is equal to or higher than 50% can also be defined as "surrounded."

Further, it is preferable for at least a part of the photoelectric sensor section 40 to be disposed so as to overlap the centroid G of the solar cell 80 in the planar view viewed from the +Z-axis direction as shown in FIG. 5. Due to such an arrangement of the photoelectric sensor section 40 and the solar cell 80 as described above, the balance (the centroid position) of the device main body 30 becomes in a favorable condition, and thus, the mountability to the user can be improved. It should be noted that the centroid G can be rephrased as the center of mass, and in the case of a three-dimensional object, the centroid G can be defined in a structure of the three-dimensional object or in a space in some cases. Further, the expression of "overlapping the centroid" can be defined as the state in which overlap occurs when projecting the position of the centroid on a two-dimensional plane or a predetermined object in the case of being viewed from a predetermined direction.

The display section 50 is disposed in an area on the center side of the inner circumference 80is of the solar cell 80 disposed to form an annular shape via the windshield plate 55. The display section 50 is provided with a configuration in which the user can visually recognize a number, an icon, or display such as a time displaying indicator displayed on a display member such as the display panel 60 disposed immediately below the windshield plate 55 via the windshield plate 55. Therefore, in the present embodiment, a variety of types of information such as the biological information, the information representing the exercise state, or the time information thus detected are displayed using the display panel 60 to present the display described above to the user from the obverse side (the +Z-axis direction). It should be noted that as the display member, there can be used an organic EL (Organic Electro-Luminescence) display, an electrophoretic display (EPD), an LED (Light Emitting Diode) display, and so on instead of the display panel 60 as the liquid crystal display.

The illumination section 61 functions as a backlight of the display panel 60. The illumination section 61 is connected to the obverse surface 20f (the first surface) of the circuit board 20. By connecting the illumination section 61 to the circuit board 20 in such a manner, it is possible to minimize the laying of the wiring for the connection, and at the same time, the light emitted from the illumination section 61 is shaded by the circuit board 20, and thus, the influence of the stray light on the photoelectric sensor section 40 can be reduced.

The secondary cell 70 has terminals of the both polarities connected to the circuit board 20 with a connection board (not shown) or the like, and supplies the circuit for controlling the power source with the electric power. Further, the secondary cell 70 is electrically connected to the solar cell 80 via the circuit board 20. The electric power is converted into a predetermined voltage in this circuit and is then supplied to each circuit to make the circuit for driving the photoelectric sensor section 40 to detect the pulsation, the circuit for driving the display panel 60, the control circuit (the CPU 21) for controlling each circuit, and so on operate. Charging to the secondary cell 70 is performed via a pair of charging terminals electrically connected to the circuit board 20 with a conductive member (not shown) such as a coil spring, or performed using the electric power generated by the solar cell 80.

Further, the secondary cell 70 is preferably disposed at a position where the secondary cell 70 does not overlap the solar cell 80 in the planar view viewed from the +Z-axis direction. By disposing the secondary cell 70 at the position where the secondary cell 70 does not overlap the solar cell 80 in the planar view viewed from the +Z-axis direction as described above, it becomes difficult for the solar cell 80 to be affected by the heat generation caused in charging the secondary cell 70, and thus, the rise in temperature of the solar cell 80 can be suppressed. Therefore, it is possible to increase the power generation efficiency in the solar cell 80.

The solar cell 80 converts the light energy of the outside light such as sunlight using the photovoltaic effect to generate the electric power. The solar cell 80 in the present embodiment is disposed between the windshield plate 55 and the display panel 60 so as to be divided into four panels, and is arranged so that the light receiving surfaces 80a, 80b, 80c, and 80d of the respective panels face to the +Z-axis direction. The solar cell 80 is located in the outer peripheral part (the outer edge part of the display section 50) including the outer edge of the display panel 60, in other words, on the outer circumference side of the case 31, and is configured to form a so-called annular shape (a ring-like shape) provided with a through hole in the central part.

Specifically, as shown in FIG. 5, the solar cell 80 is located on the opening section 31s side of the case 31, and has the outer circumference 80os as the outer edge part shaped like a circular shape shorter than the inner circumferential length of the opening section 31s, the inner circumference 80is having a circular shape as the inner edge part shorter in circumferential length than the outer circumference 80os, and two lateral sides 80ss connecting the outer circumference 80os and the inner circumference 80is to each other on the both sides, and is disposed in the outer peripheral part of the display panel 60. Specifically, in each of the panels respectively having the light receiving surfaces 80a, 80b, 80c, and 80d, there is provided the inner circumference shorter in circumferential length than the outer circumference. It should be noted that it is possible to rephrase that one shorter in radius out of the concentric circles of the solar cell 80 in the planar view viewed from the +Z-axis direction corresponds to the inner circumference, and one longer in radius corresponds to the outer circumference. The solar cell 80 in the present configuration is configured by disposing the four panels respectively having such light receiving surfaces 80a, 80b, 80c and 80d along the inner circumference of the opening section 31s of the case 31. Further, it is also possible to add the outer circumferences 80os of the four panels constituting the solar cell 80 to obtain the outer circumferential length of the solar cell 80, and add the inner circumferences 80is of the four panels to obtain the inner circumferential length of the solar cell 80. Due to such an annular arrangement of the solar cell 80, it is possible to efficiently arrange the display area of the display section 50, and by extension, it is possible to improve the design of the wrist device 200.

It should be noted that although in the present configuration, there is illustrated the solar cell 80 having the annular shape using the four panels, it is also possible for the solar cell 80 to be formed of an integrated panel. Further, in the case of constituting the solar cell 80 by a plurality of panels, the number of panels does not matter. Further, the solar cell 80 can also be formed of a film instead of the panel.

Further, it is preferable for at least a part of the connection section 25 as the contact point for electrically connecting the GPS antenna 28 and the CPU 21 supported by the circuit board 20 to each other to be disposed between the outer circumference 80os as the outer edge part and the inner circumference 80is as the inner edge. Due to such an arrangement of the connection section 25, it is possible to increase the degree of freedom of the arrangement layout of the GPS antenna 28 and the CPU 21 as the processing section, and at the same time, it is possible to improve the receiving sensitivity of the GPS antenna 28 due to the capacitive coupling between the GPS antenna 28 and the solar cell 80.

Further, the shape of the panel constituting the solar cell 80 does not matter unless the visibility of the display section 50 is damaged, or the design is damaged. For example, it is also possible to constitute the outer circumference side of each of the panels with straight lines obtained by dividing the outer circumference side at a position along the inner circumference of the opening section 31s into two equal parts, and thus, constitute the outer circumference side of all of the four panels with straight lines obtained by dividing the outer circumference side at positions along the inner circumference of the opening section 31s into eight equal parts, or to constitute the outer circumference side of each of the panels with straight lines obtained by dividing the outer circumference side at positions along the inner circumference of the opening section 31s into three equal parts, and thus, constitute the outer circumference side of all of the four panels with straight lines obtained by dividing the outer circumference side at positions along the inner circumference of the opening section 31s into twelve equal parts. Alternatively, it is also possible to divide the inner circumference of the panel into two equal parts, or three equal parts. Further, it is also possible to divide the inner circumference and the outer circumference into two equal parts, or three equal parts. Further, it is also possible to use a panel having a linear outer circumference or a linear inner circumference, and a panel not having such circumferences in combination with each other.

A storage section 180 stores the biological information such as the pulse wave due to the photoelectric sensor section 40, the location information due to the GPS receiving section 160, the body motion information due to the body motion sensor section 170, and so on in accordance with the control of the CPU 21.

According to the wrist device 200 related to the first embodiment of the portable electronic apparatus described above, by using the wavelength shortening effect due to the base 26 using the base 26 formed of the nonconductive member as the dielectric body, there is applied the GPS antenna 28 small in size and compactly constituted by the base 26 and the conductive body 27 disposed on the surface of the base 26. Further, since at least apart of the base 26 of the GPS antenna 28 for receiving the satellite signals related to the signals for positioning to be obtained by the CPU 21 as the processing section supported by the circuit board 20 is disposed so as to overlap the solar cell 80 in the planar view viewed from the +Z-axis direction, it becomes possible to house the constituents such as the solar cell 80 and the GPS antenna 28 in the case 31 also in the wrist device 200 as the small-sized portable electronic apparatus.

Further, by disposing the connection section 25 (the contact point) for electrically connecting the GPS antenna 28 and the CPU 21 to each other so as to overlap the solar cell 80 in the planar view viewed from the +Z-axis direction, it is possible to increase the degree of freedom of the arrangement layout of the GPS antenna 28 and the CPU 21, and at the same time, achieve the compact arrangement. Further, it is possible to increase the light receiving area of the solar cell 80 without affecting the receiving sensitivity of the GPS antenna 28, and thus, it is possible to increase the production of electricity in the solar cell 80.

4. Wrist Device According to Second Embodiment

Figure 9:
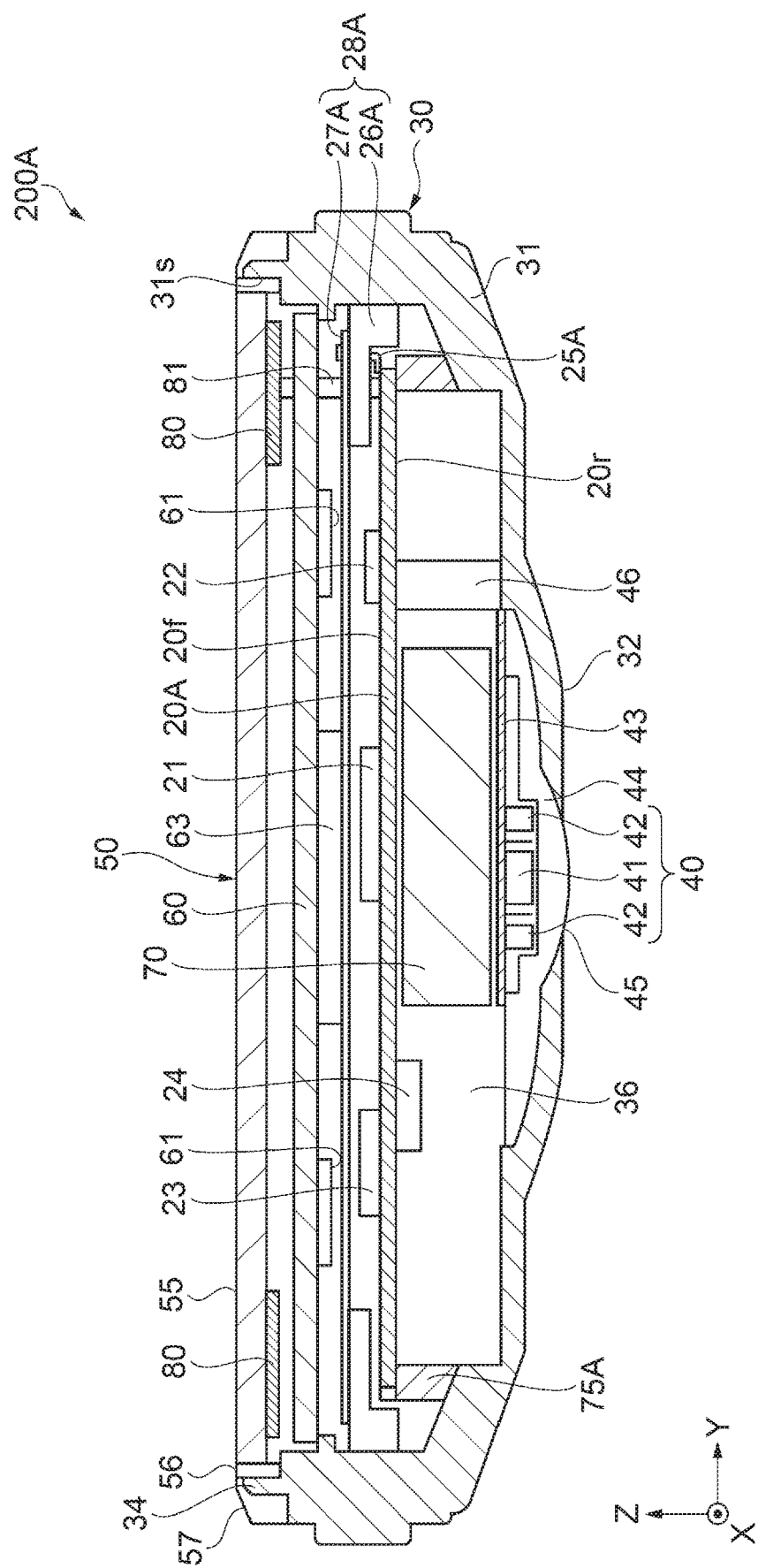
FIG. 9 is a cross-sectional view showing a configuration of a wrist device according to a second embodiment of the invention.
Figure 10:
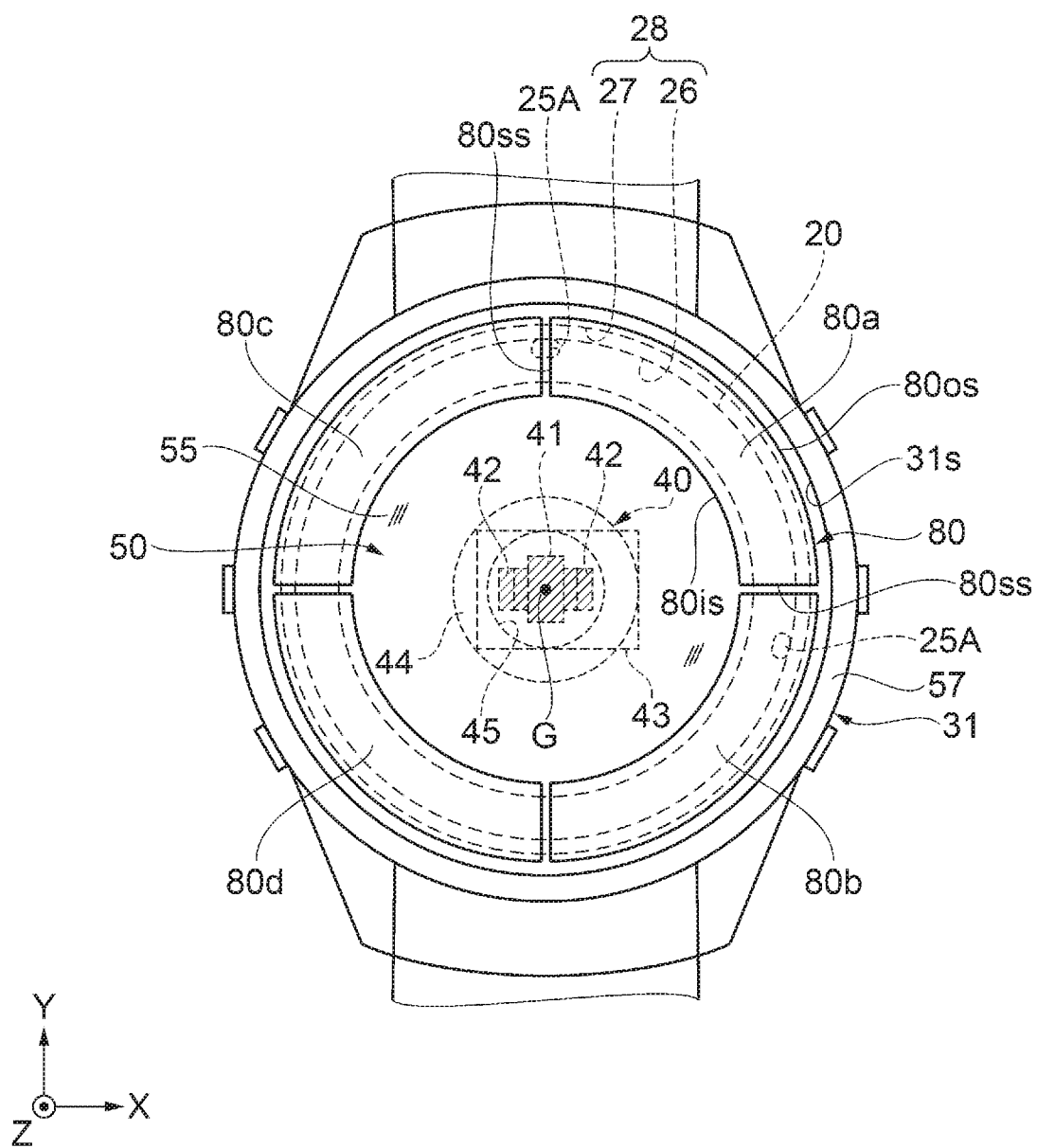
FIG. 10 is a plan view showing the configuration of the wrist device according to the second embodiment.

Then, a configuration of a wrist device (a measurement device) as the portable electronic apparatus according to a second embodiment will be described with reference to FIG. 9. FIG. 9 is a cross-sectional view showing a configuration of the wrist device according to the second embodiment. FIG. 10 is a plan view showing the configuration of the wrist device according to the second embodiment. It should be noted that in the following description related to the second embodiment, the description will be presented with a focus on the configuration different from that of the first embodiment described above, and substantially the same configuration will be denoted by the same reference numerals in each of the drawings, and the description thereof will be omitted in some cases.

The wrist device 200A according to the second embodiment shown in FIG. 9 and FIG. 10 is different from the wrist device 200 according to the first embodiment described above in the configuration and the arrangement of a GPS antenna 28A, and accordingly, a support configuration of a circuit board 20A is different from that of the first embodiment. The other parts of the configuration are substantially the same as those of the wrist device 200 according to the first embodiment described above. Hereinafter, the description will be presented with a focus on the different parts of the configuration, namely the GPS antenna 28A and the support configuration of the circuit board 20A.

Similarly to the first embodiment, the device main body 30 of the wrist device 200A according to the second embodiment has the case 31 provided with the opening section 31s opening on the obverse side, and the measurement window section 45 of the photoelectric sensor section 40 is disposed on the reverse side. The opening section 31s of the case 31 is closed by the windshield plate (a glass plate in the present embodiment) 55 which is the transparent plate as a top plate part for protecting the internal structure. Thus, the inside of the case 31 becomes the internal space 36 as a closed space disposed inside the case 31 surrounded by the case 31 and the windshield plate 55. Further, as shown in FIG. 9, the constituents of the wrist device 200A are housed in the internal space 36 located inside the case 31, but are substantially the same as those of the first embodiment, and therefore, the detailed description thereof will be omitted.

The GPS antenna 28A as the antenna section includes a base 26A formed of, for example, a resin member as a nonconductive member, and a conductive body 27A formed of metal such as copper, a copper alloy, aluminum, or an aluminum alloy and disposed on the obverse surface located on the windshield plate 55 side (the +Z-axis direction) of the base 26A. The base 26A has a shape such as an annular shape along the inner circumference of the opening section 31s of the case 31, or an annular shape obtained by combining circular arc-shaped members with each other along the inner circumference of the opening section 31s, and is fixed to the inner wall of the case 31. It should be noted that the base 26A is arranged so as to overlap the solar cell 80 in the planar view viewed from the normal direction of the light receiving surfaces 80a, 80b, 80c and 80d of the solar cell 80 (the +Z-axis direction). The conductive body 27A is formed of a metal thin plate having a roughly disc-like shape, and the outer circumferential part of the conductive body 27A is connected to the obverse surface located on the windshield plate 55 side (+Z-axis direction) of the base 26A. In the GPS antenna 28A, by using the base 26A having the nonconductive property as a dielectric body to use the wavelength shortening effect due to the base 26A (the dielectric body), the antenna is constituted. Such an antenna can be configured to be low-profile using the base 26A and the conductive body 27A disposed so as to include the obverse surface of the base 26A.

It should be noted that the base 26A constituting the GPS antenna 28A is preferably disposed on the outer side (on the outer circumference side of the case 31) of the contour of the display section 50, in other words, the inner circumference 80*is* of the solar cell 80 described later in the planar view viewed from the +Z-axis direction. By disposing the base 26A on the outer circumference side of the case 31 as described above, it is possible to increase the degree of freedom of the arrangement layout of the display section 50, the solar cell 80, and so on, and thus, it is possible to more effectively arrange the display section 50, the solar cell 80, and so on.

Further, the GPS antenna 28A is electrically connected to the CPU 21 supported by the circuit board 20A via a connection section 25A as a contact point supported by the circuit board 20A. Due to such connection, the electrical connection between the CPU 21 and the GPS antenna 28A as a separate member can compactly be achieved on the circuit board 20A. Further, it is preferable for the connection section 25A as the contact point to be disposed so as to overlap the solar cell 80 in the planar view viewed from the +Z-axis direction. By disposing the connection section 25A so as to overlap the solar cell 80 in the planar view viewed from the +Z-axis direction, it is possible to increase the degree of freedom of the arrangement layout of the GPS antenna 28A and the CPU 21, and at the same time, achieve the compact arrangement. Further, it is possible to increase the light receiving area of the solar cell 80 without affecting the receiving sensitivity of the GPS antenna 28A, and thus, it is possible to increase the production of electricity in the solar cell 80.

Further, the conductive body 27A can be disposed not only on the obverse surface side located on the windshield plate 55 side (the +Z-axis direction) of the base 26A, but also on the reverse surface side opposite to the obverse surface side. Further, it is also possible to dispose the conductive body 27A on both of the obverse surface side and the reverse surface side.

The circuit board 20A includes an obverse surface 20*f* (a first surface), and a reverse surface 20*r* (a second surface) which is a surface different from the obverse surface 20*f*, and is a surface on the opposite side to the obverse surface 20*f*. An end part on the outer circumference side of the circuit board 20A is attached to a circuit case 75A as a circuit fixation section, and thus, the circuit board 20A is supported inside the case 31 via the circuit case 75A. On the obverse surface 20*f* of the circuit board 20, there are mounted the orientation sensor 22 and the acceleration sensor 23 as the sensors included in the body motion sensor section 170, the CPU 21 as the control circuit, and so on, and on the reverse surface 20*r*, there are mounted other circuit elements 24 and so on, wherein the constituents are electrically connected to each other. Further, in an end part of the obverse surface 20*f* of the circuit board 20A, there is supported (connected) the connection section 25A as the contact point for electrically connecting the GPS antenna 28A and the CPU 21 to each other.

According to the wrist device 200A related to the second embodiment of the portable electronic apparatus described above, by using the wavelength shortening effect due to the base 26A using the base 26A formed of the nonconductive member as the dielectric body, it is possible to realize the GPS antenna 28A configured to be low-profile using the base 26A and the conductive body 27A formed of the metal thin plate disposed on the surface of the base 26A. Further, since at least a part of the base 26A of the GPS antenna 28A is disposed so as to overlap the solar cell 80 in the planar view viewed from the +Z-axis direction, it becomes possible to house the constituents such as the solar cell 80 and the GPS antenna 28A in the case 31 even in the wrist device 200A as the small-sized portable electronic apparatus.

Further, by disposing the connection section 25A (the contact point) for electrically connecting the GPS antenna 28A and the CPU 21 to each other so as to overlap the solar cell 80 in the planar view viewed from the +Z-axis direction, it is possible to increase the degree of freedom of the arrangement layout of the GPS antenna 28A and the CPU 21, and at the same time, achieve the compact arrangement. Further, it is possible to increase the light receiving area of the solar cell 80 without affecting the receiving sensitivity of the GPS antenna 28A, and thus, it is possible to increase the production of electricity in the solar cell 80.

5. Modified Examples of Arrangement of Solar Cell and GPS Antenna

Figure 11:
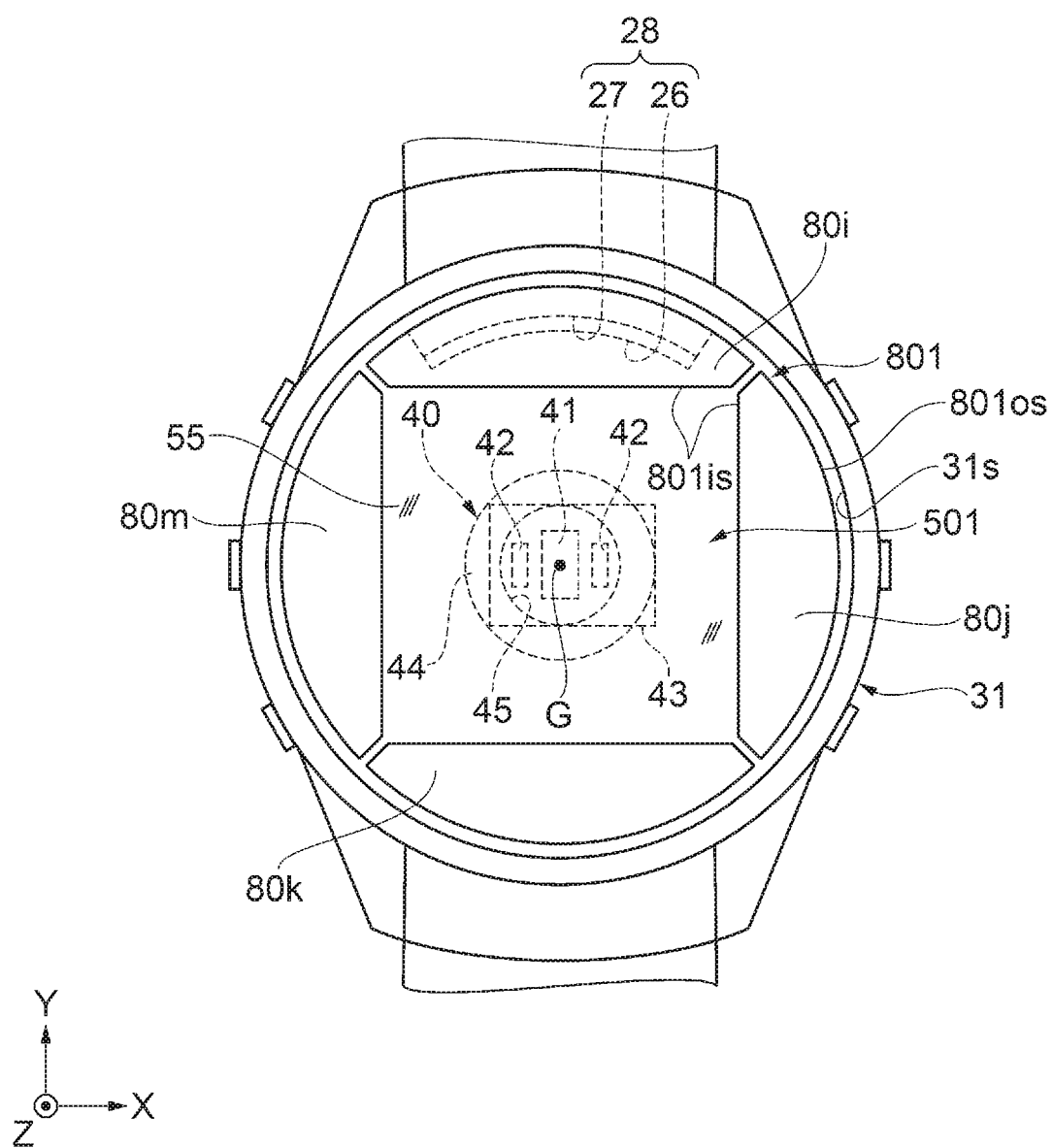
FIG. 11 is a plan view showing Modified Example 1 of an arrangement of a solar cell and a GPS antenna.
Figure 12:
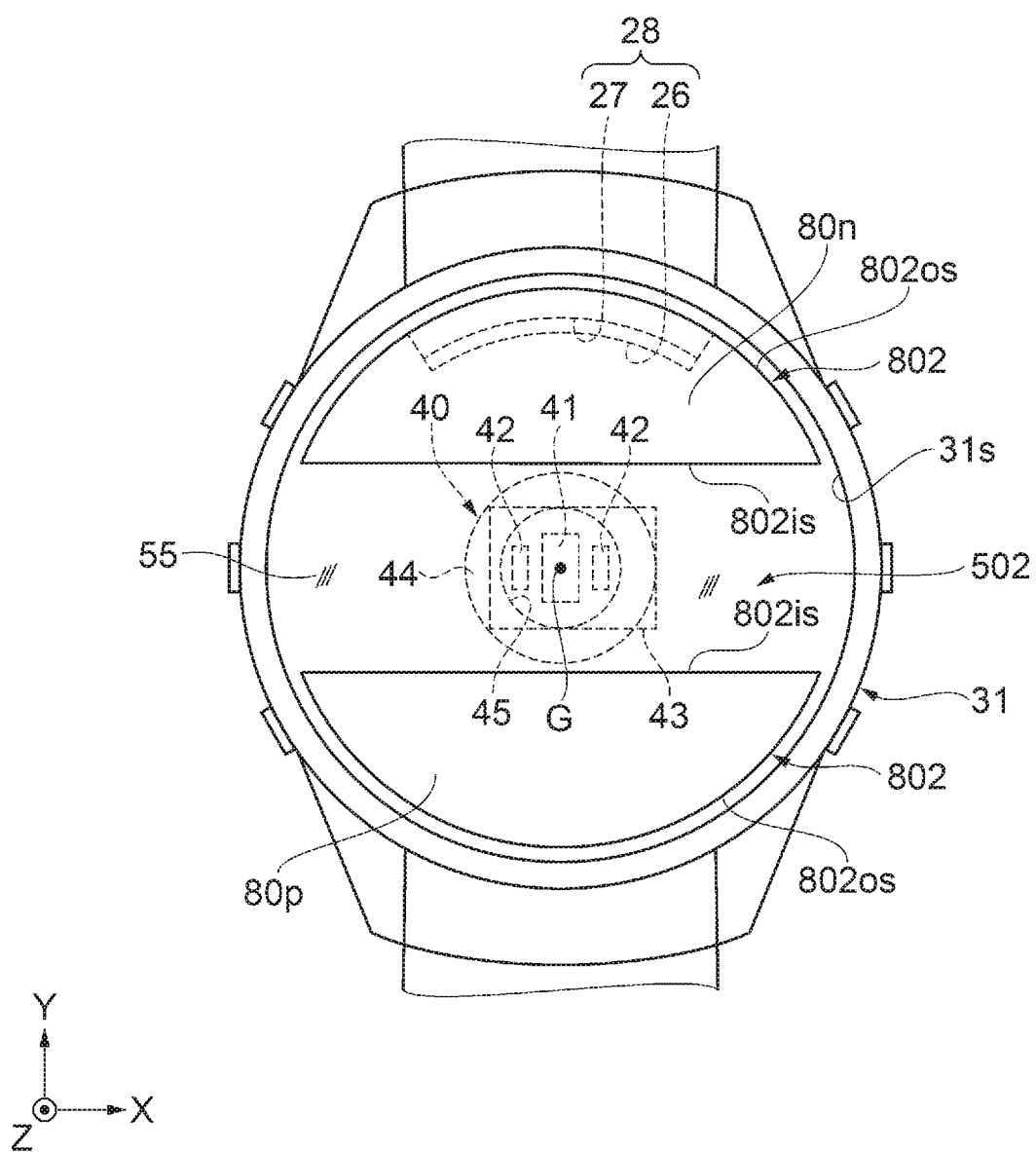
FIG. 12 is a plan view showing Modified Example 2 of the arrangement of the solar cell and the GPS antenna.
Figure 13:
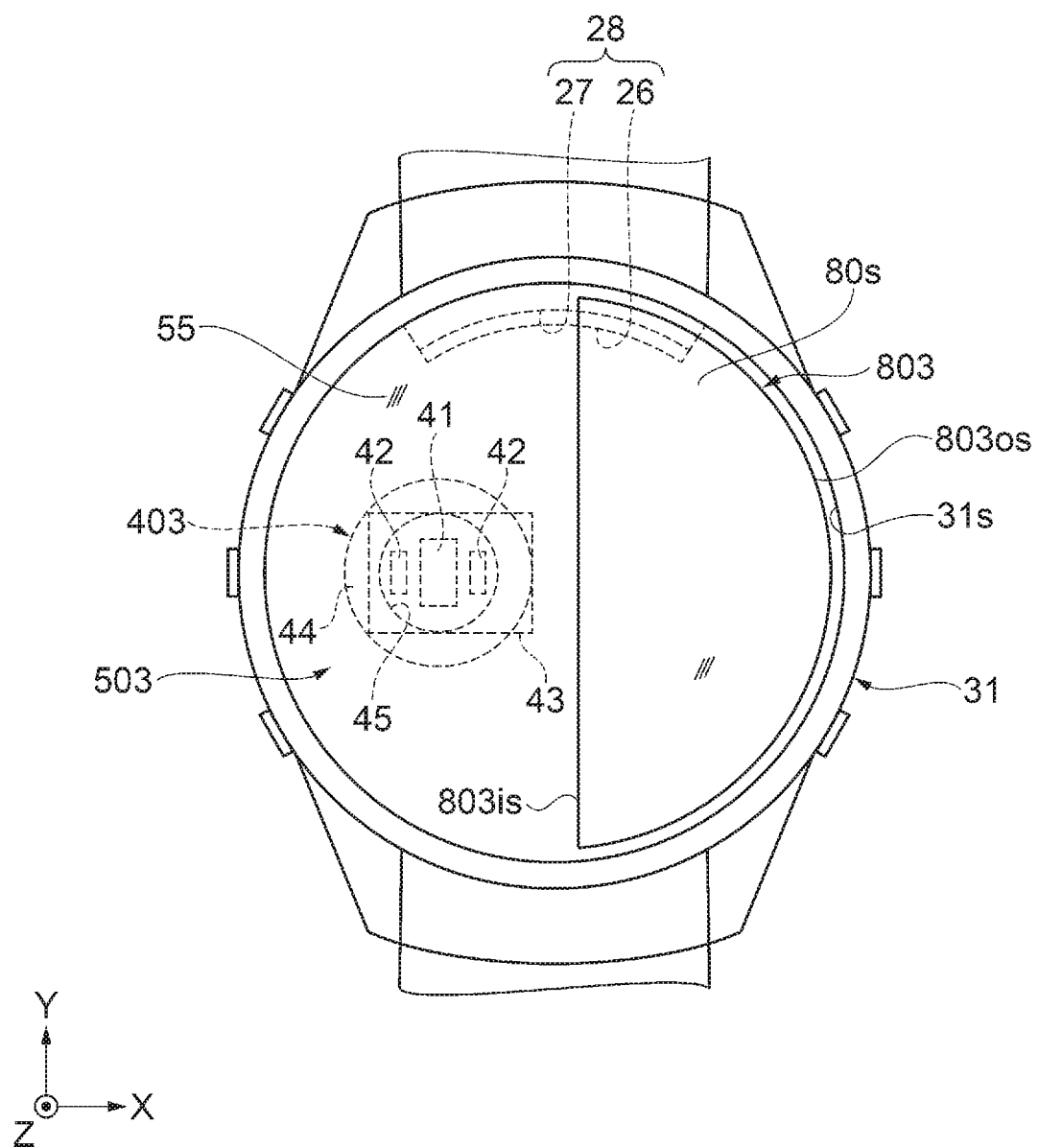
FIG. 13 is a plan view showing Modified Example 3 of the arrangement of the solar cell and the GPS antenna.
Figure 14:
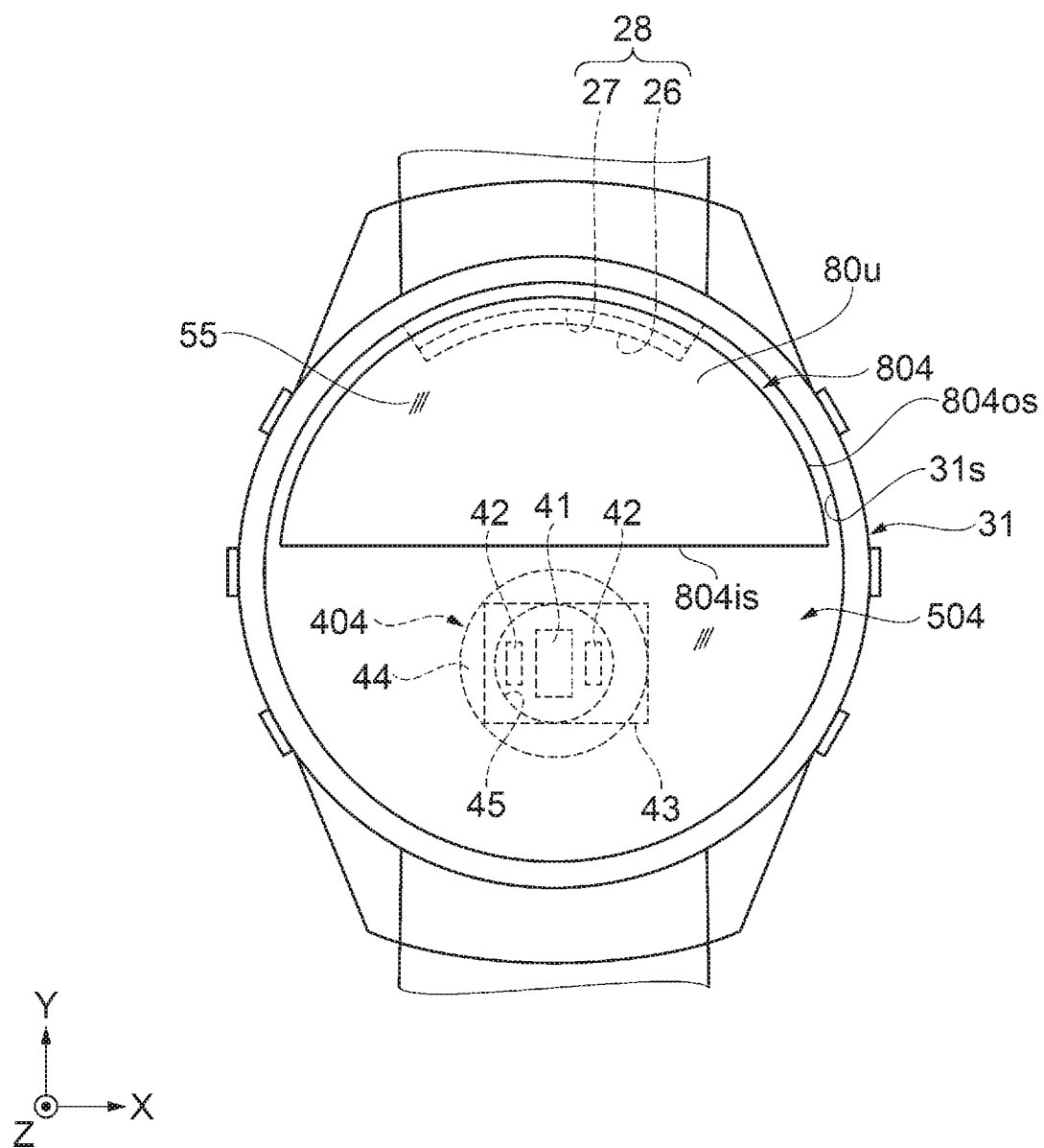
FIG. 14 is a plan view showing Modified Example 4 of the arrangement of the solar cell and the GPS antenna.

It should be noted that in the embodiments described above, the description is presented showing the configuration in which the solar cell 80 constituted by arranging the four panels shaped like a Japanese fan to form an annular shape is disposed on the outer edge side of the display panel 60, and the GPS antenna 28 is disposed at the position where at least a part of the GPS antenna 28 overlaps the solar cell 80 in the planar view viewed from the +Z-axis direction, but the arrangement configuration of the solar cell 80 and the GPS antenna 28 is not limited to this configuration. The arrangement and the configuration (the shape) of the solar cell 80 and the arrangement of the GPS antenna 28 can be modified into, for example, configurations described in the following modified examples. It should be noted that the arrangement configuration of the solar cell 80 and the GPS antenna 28 is not limited to the modified examples, but can be modified into other configurations. Hereinafter, Modified Example 1 through Modified Example 4 of the arrangement of the solar cell 80 and the GPS antenna 28 will sequentially be described with reference to FIG. 11 through FIG. 14. It should be noted that FIG. 11 through FIG. 14 are each a plan view showing a modified example of the arrangement of the solar cell and the GPS antenna, wherein FIG. 11 shows Modified Example 1, FIG. 12 shows Modified Example 2, FIG. 13 shows Modified Example 3, and FIG. 14 shows Modified Example 4.

Modified Example 1

Firstly, Modified Example 1 of the arrangement of the solar cell and the GPS antenna will be described with reference to FIG. 11. As shown in FIG. 11, a solar cell 801 according to Modified Example 1 is located between the windshield plate 55 and the display panel 60 (see FIG. 4), and is disposed so as to be divided into four panels at positions having an angle of roughly 45 degrees with respect to the X axis and the Y axis, and is arranged so that light receiving surfaces 80*i*, 80*j*, 80*k*, and 80*m* of the respective panels face to the +Z-axis direction. The solar cell 801 has an outer circumference 801*os* along the inner circumference of the opening section 31*s* of the case 31, and an inner circumference 801*is* shorter in circumferential length than the outer circumference 801*os*, and is disposed in the outer peripheral part of the display panel 60. Specifically, in each of the panels respectively having the light receiving surfaces 80*i*, 80*j*, 80*k*, and 80*m*, there is provided the inner circumference shorter in circumferential length than the outer circumference. The solar cell 801 is configured to have a through hole having a rectangular shape (a roughly square shape in the present example) in the central part due to the panels respectively provided with the light receiving surfaces 80*i*, 80*j*, 80*k*, and 80*m*. Specifically, in the solar cell 801, the outer circumference side of each of the panels has a circular arc shape, and the center side thereof has a roughly linear shape, and thus, a display section 501 having a rectangular shape is configured. It should be noted that although in the present configuration, there is illustrated the solar cell 801 using the four panels, it is also possible for the solar cell 801 to be formed of an integrated panel not divided.

Here, similarly to the first embodiment, the GPS antenna 28 includes the base 26 formed of, for example, a resin member as the nonconductive member, and the conductive body 27 disposed on the surface located on the windshield plate 55 side of the base 26. The base 26 is disposed so as to curve along the inner circumference of the opening section 31*s* of the case 31 in the 12-o'clock direction (the +Y-axis direction), and is disposed so as to overlap the solar cell 801 (the light receiving surface 80*i*) in a planar view viewed from the normal direction (the +Z-axis direction) of the light receiving surfaces 80*i*, 80*j*, 80*k* and 80*m* of the solar cell 801. In other words, the GPS antenna 28 is disposed on the outer side (on the outer circumference side of the case 31) of the contour of the display section 501, in other words, the inner circumference 801*is* of the solar cell 801 in the planar view viewed from the +Z-axis direction. By disposing the GPS antenna 28 on the outer circumference side of the case 31 as described above, it is possible to increase the freedom of the arrangement layout of the display section 501, the solar cell 801, and so on, and thus, it is possible to more effectively arrange the display section 501, the solar cell 801, and so on.

The photoelectric sensor section 40 includes at least the sensor substrate 43 to which the light emitting sections 42 and the light receiving section 41 are connected, and is located in the central part of the through hole having the rectangular shape (the roughly square shape in the present example) of the solar cell 801 in the planar view viewed from the +Z-axis direction. In other words, the photoelectric sensor section 40 is disposed inside the solar cell 801 so as not to overlap the solar cell 801 in the planar view viewed from the +Z-axis direction, and so as to be surrounded by the solar cell 801. It should be noted that the configuration of the photoelectric sensor section 40 is substantially the same as in the first embodiment, and therefore, the description thereof will be omitted here.

According to the arrangement of the solar cell 801 and the GPS antenna 28 related to Modified Example 1, it is possible to increase the degree of freedom of the arrangement layout of the solar cell 801 and the GPS antenna 28, and at the same time increase the light receiving area of the solar cell 801 without affecting the receiving sensitivity of the GPS antenna 28, and thus, it is possible to increase the production of electricity in the solar cell 801.

Modified Example 2

Then, Modified Example 2 of the arrangement of the solar cell and the GPS antenna will be described with reference to FIG. 12. As shown in FIG. 12, a solar cell 802 according to Modified Example 2 is located between the windshield plate 55 and the display panel 60 (see FIG. 4), and is formed of two panels each having a circular arc shaped outer edge on the outer circumference side, and a roughly linear straight part on the center side, and is disposed so that the roughly linear straight parts are disposed along the X axis and opposed to each other to form a display section 502 between the two panels. Specifically, the solar cell 802 has an outer circumference 802*os* along the inner circumference of the opening section 31*s* of the case 31, and an inner circumference 802*is* shorter in circumferential length than the outer circumference 802*os*, and is disposed in the outer peripheral part of the display panel 60. Specifically, in each of the panels respectively having the light receiving surfaces 80*n*, 80*p*, there is provided the inner circumference shorter in circumferential length than the outer circumference. It should be noted that the light receiving surfaces 80*n*, 80*p* of the respective panels constituting the solar cell 802 are disposed so as to face to the +Z-axis direction.

Similarly to the first embodiment, the GPS antenna includes the base 26 formed of a resin member as the nonconductive member, and the conductive body 27 disposed on the surface located on the windshield plate 55 side of the base 26. The base 26 is disposed so as to curve along the inner circumference of the opening section 31*s* of the case 31 in the 12-o'clock direction (the +Y-axis direction), and is disposed so as to overlap the solar cell 802 (the light receiving surface 80*n*) in the planar view viewed from the normal direction (the +Z-axis direction) of the light receiving surfaces 80*n*, 80*p* of the solar cell 802. In other words, the GPS antenna 28 is disposed on the outer side (on the outer circumference side of the case 31) of the contour of the display section 502, in other words, the inner circumference 802*is* of the solar cell 802 in the planar view viewed from the +Z-axis direction. By disposing the GPS antenna 28 on the outer circumference side of the case 31 as described above, it is possible to increase the freedom of the arrangement layout of the display section 502, the solar cell 802, and so on, and thus, it is possible to more effectively arrange the display section 502, the solar cell 802, and so on.

The photoelectric sensor section 40 includes at least the sensor substrate 43 to which the light emitting sections 42 and the light receiving section 41 are connected, and is located in the display section 502 disposed in the central part of the solar cell 802 in the planar view viewed from the +Z-axis direction. In other words, the photoelectric sensor section 40 is disposed at the position where the photoelectric sensor section 40 does not overlap the solar cell 802 in the planar view viewed from the +Z-axis direction. It should be noted that the configuration of the photoelectric sensor section 40 is substantially the same as described above, and therefore, the description thereof will be omitted here.

According to the arrangement of the solar cell 802 and the GPS antenna 28 related to Modified Example 2, it is possible to increase the degree of freedom of the arrangement layout of the solar cell 802 and the GPS antenna 28, and at the same time increase the light receiving area of the solar cell 802 without affecting the receiving sensitivity of the GPS antenna 28, and thus, it is possible to increase the production of electricity in the solar cell 802.

Modified Example 3

Then, Modified Example 3 of the arrangement of the solar cell and the GPS antenna will be described with reference to FIG. 13. The solar cell 803 according to Modified Example 3 shown in FIG. 13 is located between the windshield plate 55 and the display panel 60 (see FIG. 4), and is formed of a semicircular single panel located on the outer edge side of the display panel 60, and having a circular arc shaped outer edge on the outer circumference side, and a roughly linear outer edge parallel to the Y axis on the center side. Specifically, the solar cell 803 has an outer circumference 803os along the inner circumference of the opening section 31s of the case 31, and an inner circumference 803is shorter in circumferential length than the outer circumference 803os, and is disposed in either area of the outer peripheral part of the display panel 60. It should be noted that the solar cell 803 is disposed on the +X-axis side (3-o'clock side) of the case 31. Therefore, the display section 503 is disposed on the −X-axis side (9-o'clock side) of the case 31. Further, the light receiving surface 80s of the panel constituting the solar cell 803 is disposed so as to face to the +Z-axis direction.

Here, similarly to the first embodiment, the GPS antenna 28 includes the base 26 formed of a resin member as the nonconductive member, and the conductive body 27 disposed on the surface located on the windshield plate 55 side of the base 26. The base 26 is disposed so as to curve along the inner circumference of the opening section 31s of the case 31 in the 12-o'clock direction (the +Y-axis direction), and is disposed so as to overlap the solar cell 803 (the light receiving surface 80s) in the planar view viewed from the normal direction (the +Z-axis direction) of the light receiving surface 80s of the solar cell 803. In other words, the GPS antenna 28 is disposed on the outer side (on the outer circumference side of the case 31) of the contour of the display section 503, in other words, the inner circumference 803is of the solar cell 803 in the planar view viewed from the +Z-axis direction. By disposing the GPS antenna 28 on the outer circumference side of the case 31 as described above, it is possible to increase the freedom of the arrangement layout of the display section 503, the solar cell 803, and so on, and thus, it is possible to more effectively arrange the display section 503, the solar cell 803, and so on.

Here, the photoelectric sensor section 403 includes at least the sensor substrate 43 to which the light emitting sections 42 and the light receiving section 41 are connected, and is disposed within the display section 503 in the planar view viewed from the +Z-axis direction. In other words, the photoelectric sensor section 403 is disposed at the position where the photoelectric sensor section 403 does not overlap the solar cell 803 in the planar view viewed from the +Z-axis direction. It should be noted that the configuration of the photoelectric sensor section 403 is substantially the same as described above, and therefore, the description thereof will be omitted here.

According to the arrangement of the solar cell 803 and the GPS antenna 28 related to Modified Example 3, it is possible to increase the degree of freedom of the arrangement layout of the solar cell 803 and the GPS antenna 28, and at the same time increase the light receiving area of the solar cell 803 without affecting the receiving sensitivity of the GPS antenna 28, and thus, it is possible to increase the production of electricity in the solar cell 803.

It should be noted that according to the arrangement in Modified Example 3, when mounting the wrist device 200 on the wrist of the user, the +X-axis side (the 3-o'clock side) of the case 31 is located on the fingertip side of the user in many cases, and is located at the position hard to be covered with clothing (a sleeve) of the user. Therefore, by disposing the solar cell 803 on the +X-axis side (the 3-o'clock side) of the case 31 as in Modified Example 3, it is possible to increase the probability that the sunlight can be received, and thus, it is possible to perform more efficient electric power generation.

Modified Example 4

Then, Modified Example 4 of the arrangement of the solar cell and the GPS antenna will be described with reference to FIG. 14. The solar cell 804 according to Modified Example 4 shown in FIG. 14 is located between the windshield plate 55 and the display panel 60 (see FIG. 4), and is formed of a semicircular single panel located on the outer edge side of the display panel 60, and having a circular arc shaped outer edge (the outer circumference) on the outer circumference side, and a roughly linear outer edge (the inner circumference) parallel to the X axis on the center side. Specifically, the solar cell 804 has an outer circumference 804os along the inner circumference of the opening section 31s of the case 31, and an inner circumference 804is shorter in circumferential length than the outer circumference 804os, and is disposed in either area of the outer peripheral part of the display panel 60. It should be noted that the solar cell 804 is disposed on the +Y-axis side (12-o'clock side) of the case 31. Therefore, the display section 504 is disposed on the −Y-axis side (6-o'clock side) of the case 31. Further, the light receiving surface 80u of the panel constituting the solar cell 804 is disposed so as to face to the +Z-axis direction.

Here, similarly to the first embodiment, the GPS antenna 28 includes the base 26 formed of a resin member as the nonconductive member, and the conductive body 27 disposed on the surface located on the windshield plate 55 side of the base 26. The base 26 is disposed so as to curve along the inner circumference of the opening section 31s of the case 31 in the 12-o'clock direction (the +Y-axis direction), and is disposed so as to overlap the solar cell 804 (the light receiving surface 80u) in the planar view viewed from the normal direction (the +Z-axis direction) of the light receiving surface 80u of the solar cell 804. In other words, the GPS antenna 28 is disposed on the outer side (on the outer circumference side of the case 31) of the contour of the display section 504, in other words, the inner circumference 804is of the solar cell 804 in the planar view viewed from the +Z-axis direction. By disposing the GPS antenna 28 on the outer circumference side of the case 31 as described above, it is possible to increase the freedom of the arrangement layout of the display section 504, the solar cell 804, and so on, and thus, it is possible to more effectively arrange the display section 504, the solar cell 804, and so on.

Here, the photoelectric sensor section 404 includes at least the sensor substrate 43 to which the light emitting sections 42 and the light receiving section 41 are connected, and is disposed within the display section 504 in the planar view viewed from the +Z-axis direction. In other words, the photoelectric sensor section 404 is disposed at the position where the photoelectric sensor section 404 does not overlap the solar cell 804 in the planar view viewed from the +Z-axis direction. It should be noted that the configuration of the photoelectric sensor section 404 is substantially the same as described above, and therefore, the description thereof will be omitted here.

According to the arrangement of the solar cell 804 and the GPS antenna 28 related to Modified Example 4, it is possible to increase the degree of freedom of the arrangement layout of the solar cell 804 and the GPS antenna 28, and at the same time increase the light receiving area of the solar cell 804 without affecting the receiving sensitivity of the GPS antenna 28, and thus, it is possible to increase the production of electricity in the solar cell 804.

It should be noted that the description is presented citing the GPS using the GPS satellites 8 as the location information satellites provided to the Global Navigation Satellite System (GNSS) as an example of the positioning system using the location information satellites in the embodiments described above, but the GPS cited above is illustrative only. It is sufficient for the Global Navigation Satellite System to be provided with the location information satellites for transmitting the satellite signal of other systems such as Galileo (EU), GLONASS (Russia), or BeiDou (China), or the stationary satellites or the quasi-zenith satellites such as SBAS. In other words, it is also possible for the wrist device 200 to have a configuration for obtaining either one of the date information, the time information, the location information, and the speed information figured out by processing the radio waves (the wireless signals) from the location information satellites including a satellite other than the GPS satellites 8. It should be noted that Global Navigation Satellite System can be a Regional Navigation Satellite System (RNSS).

What is claimed is:

1. A portable electronic apparatus comprising:
   a case;
   a solar cell disposed in the case;
   an antenna disposed in the case and including a conductive body disposed on a surface of a nonconductive member, the antenna overlapping the solar cell in a planar view viewed from a normal direction of a light receiving surface of the solar cell and being configured to receive a positioning satellite signal;
   a photoelectric sensor disposed on a bottom side of the case; and
   a circuit board disposed between the solar cell and the photoelectric sensor so as to shade the photoelectric sensor from light entering the case from a solar cell side of the case, the circuit board being electrically connected to the solar cell and the antenna.

2. The portable electronic apparatus according to claim 1, further comprising:
   a processor supported by the circuit board; and
   a connection section supported by the circuit board and electrically connecting the antenna to the processor, the connection section overlapping the solar cell in the planar view.

3. The portable electronic apparatus according to claim 2, wherein:
   the case has an opening on one side in the normal direction,
   the solar cell includes (i) an outer edge part having a length shorter than an inner circumferential length of the opening, and (ii) an inner edge part having a length shorter than the length of the outer edge part in the planar view, and
   at least a part of the connection section is disposed between the outer edge part and the inner edge part.

4. The portable electronic apparatus according to claim 3, further comprising:
   a display section electrically connected to the processor, wherein an outer circumferential end part of the display section is disposed between the outer edge part and the inner edge part of the solar cell in the planar view.

5. The portable electronic apparatus according to claim 4, wherein the antenna is disposed on an outer side of a contour of the display section in the planar view.

6. The portable electronic apparatus according to claim 2, wherein the connection section is a contact point electrically connecting the conductive body to the processor.

7. The portable electronic apparatus according to claim 1, wherein the conductive body of the antenna is disposed between the solar cell and the circuit board in a cross-sectional view viewed from a direction perpendicular to the normal direction of the light receiving surface.

8. The portable electronic apparatus according to claim 1, wherein at least a part of the nonconductive member overlaps the solar cell in the planar view.

* * * * *